(12) United States Patent
Tavares et al.

(10) Patent No.: US 10,174,424 B2
(45) Date of Patent: Jan. 8, 2019

(54) METHODS FOR THE PHOTO-INITIATED CHEMICAL VAPOR DEPOSITION (PICVD) OF COATINGS AND COATINGS PRODUCED BY THESE METHODS

(71) Applicant: POLYVALOR, LIMITED PARTNERSHIP, Montreal (CA)

(72) Inventors: Jason Robert Tavares, Longueuil (CA); Christopher Alex Dorval Dion, Montreal (CA)

(73) Assignee: Polyvalor, Limited Partnership, Montreal (CA)

( * ) Notice: Subject to any disclaimer, the term of this patent is extended or adjusted under 35 U.S.C. 154(b) by 147 days.

(21) Appl. No.: 14/786,783

(22) PCT Filed: Apr. 17, 2014

(86) PCT No.: PCT/CA2014/050389
§ 371 (c)(1),
(2) Date: Oct. 23, 2015

(87) PCT Pub. No.: WO2014/172789
PCT Pub. Date: Oct. 30, 2014

(65) Prior Publication Data
US 2016/0097125 A1 Apr. 7, 2016

Related U.S. Application Data

(60) Provisional application No. 61/815,779, filed on Apr. 25, 2013, provisional application No. 61/915,602, filed on Dec. 13, 2013.

(51) Int. Cl.
*B32B 5/16* (2006.01)
*B05D 7/00* (2006.01)
(Continued)

(52) U.S. Cl.
CPC .............. *C23C 16/482* (2013.01); *B05D 1/60* (2013.01); *B05D 3/061* (2013.01); *B22F 1/02* (2013.01);
(Continued)

(58) Field of Classification Search
CPC ..................................... C23C 16/422
(Continued)

(56) References Cited

U.S. PATENT DOCUMENTS 4,435,445 A     3/1984  Allred et al.
4,631,199 A *  12/1986  Hall ..................... C23C 16/402
                                                 257/E21.279
(Continued)

FOREIGN PATENT DOCUMENTS

FR      2950080      3/2011
JP     H02030766     2/1990
(Continued)

OTHER PUBLICATIONS

Zheng et al, Efficient CVD growth of single-walled carbon nanotubes on surfaces using carbon monoxide precursor, Nano Lett., 2002, vol. 2, No. 8, 895-898.*
(Continued)

*Primary Examiner* — Hoa (Holly) Le
(74) *Attorney, Agent, or Firm* — Isabelle Pelletier

(57) ABSTRACT

Methods for producing coatings on substrates are provided. These methods comprise the steps of introducing the substrate in a photo-initiated chemical vapor deposition reactor, introducing a gas precursor in the reactor, irradiating said gas precursor with UV radiation at a given wavelength, thereby at least partly photodissociating the gas precursor, until the coating is formed. In one method, the gas precursor is a mixture comprising carbon monoxide and hydrogen. In another method, the pressure in the react or is between about (Continued)

0.75 and 1.25 atm and the gas precursor has an absorption cross section of about $5 \times 10^{-16}$ cm$^2$/molecule or less at said given wavelength. In another aspect, the substrate is ash.

18 Claims, 24 Drawing Sheets

(51) Int. Cl.
    *C23C 16/48*     (2006.01)
    *C23C 16/30*     (2006.01)
    *C23C 16/44*     (2006.01)
    *B05D 3/06*     (2006.01)
    *B05D 1/00*     (2006.01)
    *C09D 161/06*     (2006.01)
    *B22F 1/02*     (2006.01)
    *B22F 1/00*     (2006.01)

(52) U.S. Cl.
    CPC ............ *C09D 161/06* (2013.01); *C23C 16/30* (2013.01); *C23C 16/4417* (2013.01); *B22F 1/0018* (2013.01)

(58) Field of Classification Search
    USPC ......... 427/492, 521, 212, 222; 428/403, 407
    See application file for complete search history.

(56) References Cited

U.S. PATENT DOCUMENTS

| | | | |
|---|---|---|---|
| 4,816,294 A | 3/1989 | Tsuo et al. | |
| 5,215,588 A | 6/1993 | Rhieu | |
| 2002/0038925 A1* | 4/2002 | Reimer | A43D 25/20 264/448 |
| 2007/0235690 A1* | 10/2007 | Marking | C09K 11/771 252/301.4 P |
| 2010/0209628 A1* | 8/2010 | Girshick | B22F 1/02 427/595 |
| 2011/0254449 A1* | 10/2011 | Murnick | H01J 63/02 315/111.81 |
| 2012/0177844 A1* | 7/2012 | Biver | B05D 1/60 427/562 |
| 2013/0078374 A1* | 3/2013 | Salah | B82Y 40/00 427/215 |

FOREIGN PATENT DOCUMENTS

| | | |
|---|---|---|
| WO | 8304420 | 12/1983 |
| WO | 9928529 | 6/1999 |
| WO | 01/78891 A1 | 10/2001 |
| WO | 2008/130688 A1 | 10/2008 |

OTHER PUBLICATIONS

Tavares, Jason Robert. Low-cost nanoparticles obtained from waste. 80th Conference of Association canadienne-française pour l'avancement des sciences (ACFAS), Montreal, May 7-11, 2012, Abstract.
Dorval-Dion, Christopher Alex, Tavares, Jason Robert. Scalable gas phase nanoparticle treatment methods required for large-scale nanofluid and nanocomposite synthesis. TechConnect Word, Santa Clara, CA, Jun. 18-21, 2012, Abstract and slides.
Tavares, Jason Robert, Dorval-Dion, Christopher Alex. PhotocVD as a Viable Alternative for the Low-cost and Scalable Surface Functionalization of Nanoparticles. 62nd Canadian Chemical Engineering Conference, Vancouver, Oct. 14-17, 2012, Abstract and slides.
Supplementary European Search Report, dated Dec. 16, 2016.
R. Ashokan, R. Singh, V. Gopal and M. Anandan. Structural Characterization of Photochemically Grown Silicon Dioxide Films by Ellipsometry and Infrared Studied. J. Appl. Phys., 73, 3943-3950, 1993.
A.M. Boies, S. Calder, P. Agarwal, P. Lei and S.L. Girshick. Chemical Kinetics of Photoinduced Chemical Vapor Deposition: Silica Coating of Gas-Phase Nanoparticles. J. Phys. Chem. C, 116, 104-114, 2012.
A.M. Boies, J.T. Roberts, S.L. Girshick, B. Zhang, T. Nakamura and A. Mochizuki. SiO2 coating of silver nanoparticles by photoinduced chemical vapor deposition. Nanotechnology, 20, 1-8, 2009.
K.L. Choy. Chemical vapour deposition of coatings. Progress in Materials Science, 48, 57-170, 2003.
P.B. Comita, J. Farkas, B. Yang, Y.H. Chuang, J. O'Connor and M.G. Cohen. Pulsed ultraviolet laser deposition of SiO2. Appl. Phys. Lett. 66, 1463-1465, 1995.
C.A. Dorval Dion and J.R. Tavares. Scalable gas phase nanoparticle treatment methods required for large-scale nanofluid and nanocomposite synthesis. Nanotechnology 2012: Electronics, Devices, Fabrication, MEMS, Fluidics and Computational, 2,392-395 (2012).
C.A. Dorval Dion and J.R. Tavares. Photo-initiated chemical vapor deposition as a scalable particle functionalization technology (a practical review). Powder Technology, 239, 484-491, 2013.
C.A. Dorval, W. Raphael, E. Tong and J.R. Tavares. Photo-initiated chemical vapor deposition of thin films using syngas for the functionalization of surfaces at room temperature and near-atmospheric pressure. Surface & Coatings Technology, 244, 98-108, 2014.
D. Farhanian, C.A. Dorval Dion, W. Raphael, G. De Crescenzo and J.R. Tavares. Combined extraction and funtionalization of low-cost nanparticles from municipal solid waste fly ash through PICVD. J. Env. Chem. Eng., 2, 2242-2251, 2014.
A.C. Fozza, J.E. Klemberg-Sapieha and M.R. Wertheimer. Vacuum Ultraviolet Irradiation of Polymers. Plasmas and Polymers, 4, 183-206, 1999.
A.C. Fozza, M. Moisan and M.R. Wertheiner. Vacuum Ultraviolet to Visible Emission From Hydrogen Plasma: Effect of Excitation Frequency. J. Appl. Phys., 88, 20-33, 2000.
M. Hudis and L.E. Prescott. Surface Crosslinking of Polyethylene Produced by the Ultraviolet Radiation From a Hydrogen Glow Discharge. Polymer Letters, 10, 179-183, 1972.
M. Karsi, A. Reynes and R. Morancho. Comparative Study of Copper Deposits Obtained by Thermal Decomposition and Photo-Assisted Chemical Vapour Deposition of 3-Diketonate Complexes. Journal de Physique IV, 3, 273-280, 1993.
M. Kuzuya, T. Yamashiro, S. Kondo, M. Sugito and M. Mouri. Plasma-Induced Surface Radicals of Low-Density Polyethylene Studied by Electron Spin Resonance. Macromolecules, 31, 3225-3229, 1998.
C. Licoppe, C. Meriadec, J. Flicstein, Y.I. Nissim, E. Petit and J.M. Moisnon. Surface Mechanisms in the UVCVD of SiO2 Films. Journal of Physique IV, 1, C2-357-C2-364, 1991.
C. Licoppe, C. Meriadec, Y.I. Nissim and J.M. Moison. Surface mechanisms in the UVCVD of SiO2 Films. Applied Surface Science, 54, 445-452, 1992.
F. Maury. Recent Trends in the Selection of Metal-Organic Precursors for MOCVD Process. Journal de Physique IV, 5, C5-449-05-463, 1995.
S. Onari. Vacuum Ultraviolet Absorption Spectra of Synthesized Polymer Films. Journal of the Physical Society of Japan, 26, 500-504, 1969.
R.H. Partridge. Vacuum-Ultraviolet Absorption Spectrum of Polyethylene. The Journal of Chemical Physics, 45, 1685-1690, 1966.
R.H. Partridge. Vacuum-Ultraviolet Absorption Spectrum of Polystyrene. The Journal of Chemical Physics, 47, 4223-4227, 1967.
R.H. Partridge. Exciton Interpretation of the Vacuum-Ultraviolet Absorption Spectra of Saturated Organic Polymers. The Journal of Chemical Physics, 49, 3656-3668, 1968.
V.E. Skurat and Y.I. Dorofeev. The Transformations of Organic Polymers During the Illumination by 147.0 and 123.6 nm Light. Die Angewandte Makromolekulare Chemie, 216, 205-224, 1994.
J. Tavares, E.J. Swanson, and S. Coulombe. Plasma Synthesis of Coated Metal Nanoparticles with Surface Properties Tailored for Dispersion. Plasma Processes and Polymers, 5, 759-769, 2008.
F. Truica-Marasescu, S. Guimond and M.R. Wertheimer. VUV-Induced Nitriding of Polymer Surfaces: Comparison with Plasma

(56) References Cited

OTHER PUBLICATIONS

Treatments in Nitrogen. Nuclear Instruments and Methods in Physics Research B, 208, 294-299, 2003.

F. Truica-Mareasescu and M.R. Wertheimer. Vacuum Ultraviolet-Induced Photochemical Nitriding of Polyolefin Surfaces. Journal of Applied Polymer Science, 91, 3886-3898, 2004.

F.-E. Truica-Marasescu and M.R. Wertheimer. Vacuum Ultraviolet Photolysis of Hydrocarbon Polymers. Macromolecular Chemistry and Physics, 206, 744-757, 2005.

F. Truica-Marasescu and M.R. Wertheimer. Vacuum-Ultraviolet Photopolymerisation of Amine-Rich Thin Films. Macromolecular Chemistry and Physics, 209, 1043-1049, 2008.

S. Vidal, F. Maury, A. Gleizes, and C. Mijoule. Photo-assisted MOCVD of copper using Cu(hfa) (COD) as precursor. Applied Surface Science 168, 57-60, 2000.

M.R Wertheimer, A.G. Fozza and A. Hollander. Industrial Processing of Polymers by Low-Pressure Plasmas: The Role of VUV Radiation. Nuclear Instruments and Methods in Physics Research B, 151, 65-75, 1999.

R. Wilken, A. Hollander and J. Behnisch. Nitric Oxide Radical Trapping Analysis on Vacuum-Ultraviolet Treated Polymers. Macromolecules, 31, 7613-7617, 1998.

R. Wilken, A. Hollander and J. Behnisch. Surface Radical Analysis on Plasma-Treated Polymers. Surface and Coatings Technology. 116-119, 991-995, 1999.

B. Zhang, Y.-C. Liao and S.L. Girshick. Growth of Coating on Nanoparticles by Photoinduced Chemical Vapor Deposition. J. Nanopart. Res., 10, 173-178, 2008.

International Search Report, dated Jul. 21, 2014.

\* cited by examiner

METHODS FOR THE PHOTO-INITIATED CHEMICAL VAPOR DEPOSITION (PICVD) OF COATINGS AND COATINGS PRODUCED BY THESE METHODS

CROSS REFERENCE TO RELATED APPLICATIONS

This application is a National Entry Application of PCT application no PCT/CA2014/050389 filed on Apr. 17, 2014 and published in English under PCT Article 21(2), which itself claims benefit of U.S. provisional applications Ser. Nos. 61/815,779 and 61/915,602, filed on Apr. 25, 2013 and Dec. 23, 2013, respectively. All documents above are incorporated herein in their entirety by reference.

FIELD OF THE INVENTION

The present invention relates to methods of producing coatings on substrates. More specifically, the present invention is concerned with methods for producing hydrophobic and hydrophilic coatings by PICVD.

BACKGROUND OF THE INVENTION

The need for organic surface modification arises from the desire to develop materials capable of serving multiple functions beyond their native properties. For example, while one may require the mechanical strength-to-weight ratio and corrosion resistance of stainless steel to build reactors in the cosmetics industry, but may also need the surface of the reactor walls to repel the often sticky cosmetic formulations—properties that are not native to the base material—while ensuring that the cosmetic product is not in any way contaminated.

In the field of nanomaterials, the exceptional conductivity of carbon nanotubes makes them ideal materials to form conductive nanocomposites for the aeronautics industry; at the same time, their homogeneous dispersion and appropriate distribution in a polymer matrix requires that they be imparted with a significant surface charge and functional groups that are stable over a wide range of processing temperatures and compatible with the host matrix. Further, surface treatment for nanoparticles may also be required to avoid agglomeration.

Surface modification can currently be achieved through two main streams: adsorption and functionalization.

Surface adsorption is the simplest method to impart a charge or steric hindrance to a surface by using compounds known as surfactants. These are widely used in the field of colloids to promote dispersion of small particles in a host fluid. On macroscopic surfaces, these compounds can also be used to form self-assembled monolayers (SAMS) that can, for example, alter the wettability of a surface. Various functional moieties can also be applied using SAMS. However, the basic functionalities achievable through surface adsorption face a severe limitation: the coating is not bonded to the surface and is thus prone to thermal or mechanical desorption (surfactants are known to desorb at temperatures as low as 70° C.).

On the other hand, functionalization allows for the formation of a strong covalent bond between the functional moiety and the substrate. Functionalization can be achieved through solvent-based chemistry or gas-phase deposition.

The currently favoured liquid-based methods can be fairly problematic: achieving the desired functionality requires knowledge about the specific reactions or reaction mechanisms (often complex and multi-step, and involving potentially toxic solvents and reactants). Moreover, it can be quite difficult to identify the appropriate medium through which to conduct the functionalization reactions (the substrates and the functionalization reagents may not be compatible with the same solvent). Furthermore, in the case of nanoparticle functionalization, the separation of the functionalized particles from the leftover reagents, undesirable by-products and solvents typically requires significant downstream processing, thereby leading to efficiency loss, which limits the potential for scale-up and increases the overall cost of treatment. These difficulties are compounded when attempting to form multi-functional or "smart" surfaces, given the increased number of reagents and possible products involved. These methodological shortcomings are generally dodged in the literature.

Solvent-free gas-phase methods, typically referred to as chemical vapour deposition (CVD), do not face these particular issues: gases are miscible (at normal pressure) and readily separate from solid substrates. In a typical CVD process, a substrate is exposed to one or more volatile precursors (gas), which react and/or decompose on the substrate surface to produce a coating. The advantage of this technique is that it allows rapid deposition of a consistent and clean coating. CVD is typically stimulated or initiated by one (or a combination) of three energy sources: heat, plasma or light.

Thermally activated CVD (TACVD) is mostly reserved to inorganic coatings, as the high temperatures required to achieve the desired reaction activation energy are incompatible with most organic compounds. This limitation can be curtailed in some cases through the use of initiator compounds.

Plasma-enhanced CVD (PECVD) allows for the creation of a non-thermal highly reactive environment through ionization, which leads to strong electron, ion and UV light bombardment of organic species. PECVD has been extensively used to form thin organic coatings (often referred to as "plasma polymerization"). The possibility of using PECVD for tailoring the wettability of surfaces by adjusting the process parameters of plasma enhanced CVD has been demonstrated. It was also shown that UV light contributes to PECVD's efficiency. While this technique is successful for organic surface functionalization, it suffers from a processing point of view. Indeed, it requires specialized equipment and, in most cases, that processing occurs under low pressure, thus limiting treatment volumes and throughput. Moreover, the use of certain electronegative compounds, such as oxygen, can rob PECVD of its efficiency. This technique is therefore best suited for high value-added applications.

Photo-initiated CVD (PICVD) allows for a decoupling of the useful components of plasma processing (such as UV radiation and use of small organic precursor compounds) from the process itself. Thus, specific plasma processing conditions, such as operating under vacuum, can be avoided. Indeed, UV lamps (typically glow discharge plasmas) are separated from the process by a UV-transparent window, thereby allowing for the functionalization process to operate under atmospheric or near-atmospheric conditions. Photochemical reactions have been used to grow $SiO_2$ layers in the semi-conductor industry and to deposit certain organic coatings on macroscopic surfaces.

These processes typically resort to high-energy, low-wavelength vacuum UV (VUV, <200 nm) or extreme UV (EUV, <121 nm) sources such as $D_2$, Hg or excimer lamps, or custom-made plasma sources. In fact, PICVD efforts have almost all relied on the use of such VUV and EUV sources.

This is due to the fact that, at such low wavelengths, it is possible to specifically target certain molecular bonds and break them. This favors large coating thickness and fast deposition kinetics, which are the main focus of the semiconductor industry, from which most PICVD studies arise. In fact, there is an established consensus in the PICVD literature that it is necessary to use a light source emitting radiation close to the peak absorption of the gas precursor used for PICVD to be useful. Therefore, light sources are chosen so as to emit at a wavelength at which the gas precursor used exhibits a significant absorption cross-section. However, it should be noted that VUV and EUV sources can be very costly. In addition, they require the use of specific window materials to allow for light transmission. In fact, $MgF_2$, LiF, and $CaF_2$ are the only common materials with significant transparency below 200 nm, and these expensive materials are fragile and particularly prone to chemical attack, which complicates VUV and EUV PICVD. In the absence of a light source with the appropriate emission wavelength, the literature teaches, in some cases, to use a photosensitizer compound sensitive to the wavelength of the light source. See references 1-5 in the section entitled "References" below.

PICVD has only sparsely been used for the coating of nanomaterials, but it has been shown to have potential as a gas phase nanoparticle treatment.

On another subject, syngas (also called synthesis gas) is a fuel gas mixture consisting primarily of hydrogen, carbon monoxide, and very often some carbon dioxide. It is combustible, but has less than half the energy density of natural gas. Syngas is a product of several processes, including steam reforming and waste destruction processes such as gasification. Generally, syngas is converted into hydrocarbons or alcohols via various catalytic processes or is burned in a turbine to produce energy (with average to low efficiency). The most common catalytic pathway is the Fischer-Tropsch process.

On yet another subject, UVC light sources have been used in the field of photochemistry to stimulate polymerization reactions (curing), to degrade harmful organics in wastewater (photocatalysis), for lithography and, recently, for nanomaterials synthesis.

On a last subject, nanoparticles, and nanomaterials more generally, are used in scientific fields such as optical and biomedical applications. These applications generally use expensive advanced materials of controlled size and composition. Some other applications would however benefit from cheaper sources of such materials. Nevertheless, by their very nature, nearly all raw nanomaterials need to be surface functionalized prior to incorporation into matrices for use in applications.

In the hope of finding cheaper sources of nanomaterials, attention has recently been paid to unconventional sources of ultrafine powders, such as ash from municipal solid waste (MSW), coal, cane and oil shale. Such interest is mainly justified because the accumulation of large quantities of ash is becoming a serious environmental problem. Both MSW and fly ash are considered as renewable resources. Fly ash is currently disposed of in landfills or used in cements. However, it should be noted that MSW fly ash has a variable composition. Indeed, the composition can vary according to the source of the ash, but typical compositions are silica (49-64% wt), alumina (14-30% wt), iron oxide (6-23% wt) and CaO (1-7% wt). On the other hand, MSW fly ash may contain some valuable materials including As, Al, B, Ba, Cd, Cr, Cu, Hg, Mn, Mo, Ni, Pb, Sb, Se, Zn, in oxidized or ionic salt form.

SUMMARY OF THE INVENTION

In accordance with the present invention, there is provided:

1. A method for producing a coating on a substrate, the method comprising the steps of:
    introducing the substrate in a photo-initiated chemical vapor deposition reactor,
    introducing a gas precursor in the reactor so that the pressure in the reactor is between about 0.75 and 1.25 atm, and
    irradiating said gas precursor with MUV radiation at a given wavelength, thereby at least partly photodissociating the gas precursor, until the coating is formed, the gas precursor having an absorption cross section of about $5 \times 10^{-16}$ cm$^2$/molecule or less at said given wavelength.
2. The method of item 1, wherein the absorption cross section is of about $1 \times 10^{-16}$ cm$^2$/molecule or less.
3. The method of item 2, wherein the absorption cross section is of about $7 \times 10^{-17}$ cm$^2$/molecule or less.
4. The method of item 3, wherein the absorption cross section is of about $5 \times 10^{-17}$ cm$^2$/molecule or less.
5. The method of item 4, wherein the absorption cross section is of about $2 \times 10^{-17}$ cm$^2$/molecule or less.
6. The method of any one of items 1 to 5, wherein the gas precursor is an organic gas, ammonia, hydrogen, nitrogen, oxygen, carbon dioxide, or carbon monoxide, or a mixture thereof.
7. The method of item 6, wherein the gas precursor is a $C_{1-12}$-alcohol (such as methanol, ethanol, propanol, butanol, glycerol, phenol), a $C_{1-12}$-alkane (such as methane, ethane, propane, butane, pentane, hexane, heptane), a $C_{1-12}$-alkene (such as ethylene), a $C_{1-12}$-alkyne (such as acetylene), acetic acid, acetone, acrylic acid, ammonia, carbon dioxide, carbon monoxide, ethylene glycol (including oligomers and polymers thereof), formaldehyde, hydrogen ($H_2$), methanal, methyl methacrylate, nitrogen, a nitrogen oxide, oxygen, ozone, peroxide, sulfur oxide, water, or a mixture thereof.
8. The method of item 7, wherein the gas precursor is a mixture of carbon monoxide and hydrogen.
9. The method of item 8, wherein the gas precursor is syngas.
10. The method of any one of items 1 to 9, wherein said given wavelength is about 254 nm.
11. The method of any one of items 1 to 10, wherein the MUV radiation is emitted by a low pressure germicidal lamp.
12. The method of any one of items 1 to 11, wherein the gas precursor is heated at a temperature above room temperature
13. The method of any one of items 1 to 12, wherein the substrate is held at a temperature between about 30 and 50° C.
14. The method of any one of items 1 to 13, wherein the substrate is copper, wood, steel, $TiO_2$, ZnO, or ash.
15. A method for producing a coating on a substrate, the method comprising the steps of:
    introducing the substrate in a photo-initiated chemical vapor deposition reactor,
    introducing carbon monoxide (CO) and hydrogen ($H_2$), as gas precursors, in the reactor, and
    irradiating said gas precursors with UVC radiation, thereby at least partly photodissociating the carbon monoxide, until the coating is formed.

16. The method of item 15, wherein the carbon monoxide and hydrogen are contained in syngas.
17. The method of item 15 or 16, wherein the UVC radiation is emitted by a xenon lamp, a krypton lamp, an excimer xenon lamp, a deuterium hydrogen lamp, or a germicidal lamp.
18. The method of item 17, wherein the UVC radiation is emitted by a low pressure germicidal lamp.
19. The method of any one of items 15 to 18, wherein the UVC radiation has a wavelength of about 254 nm.
20. The method of any one of items 15 to 19, wherein the pressure in the reactor is between about 0.75 and 1.25 atm.
21. The method of any one of items 15 to 20, wherein the gas precursors are heated at a temperature above room temperature.
22. The method of item 21, wherein the gas precursors are heated at a temperature between about 20 and about 70° C.,
23. The method of any one of items 15 to 22, wherein the substrate is held at a temperature between about 20 and about 80° C.
24. The method of item 23, wherein the substrate is held at a temperature between about 20 and about 30° C.
25. The method of any one of items 15 to 24, wherein the hydrogen and the carbon monoxide are present in a $H_2/CO$ ratio varying between about 1/16 to about 4.
26. The method of any one of items 15 to 25, wherein the relative pressure in the reactor, the position of the substrate in the reactor and the $H_2/CO$ molar ratio are such that the coating is hydrophilic.
27. The method of any one of items 15 to 25, wherein the relative pressure in the reactor, the position of the substrate in the reactor and the $H_2/CO$ molar ratio are such that the coating is hydrophobic.
28. The method of any one of items 15 to 27, preferably item 26, wherein the substrate is ash.
29. The method of any one of items 15 to 27, wherein the substrate is copper, wood, steel, $TiO_2$, ZnO, or ash.
30. A coating produced by the method of any one of items 15 to 29.
31. The coating of item 30 being hydrophilic.
32. The coating of item 30 being hydrophobic.
33. A coated substrate produced by the method of any one of items 15 to 29.
34. A method of coating nanoparticles comprising the steps of:
   (a) providing nanoparticles, and
   (b) carrying out the coating method of any one of items 1 to 28 on the nanoparticles.
35. A method of item 34, wherein step (b) is:
   carrying out the coating method of any one of items 15 to 28 on the nanoparticles.
36. A method of item 35, wherein step (b) is:
   carrying out the coating method of item 26 or 27 on the nanoparticles.
37. The method of any one of items 34 to 36, wherein the nanoparticles are in a fluidized state during step (b).
38. The method of any one of items 34 to 37, wherein step b) is carried out on ash comprising nanoparticles mixed with bigger particles.
39. The method of item 38 further comprising after step (b), the step of:
   (c) isolating the coated nanoparticles from the coated bigger particles.
40. The method of item 39, wherein step c) comprises:
   (c') dispersing the coated ash in a suspension liquid,
   (c'') allowing the coated bigger particles to settle and allowing a supernatant comprising the coated nanoparticles to form,
   (c''') separating the supernatant from the settled bigger particles.
41. The method of item 40, wherein the suspension liquid is a polar solvent, when the coating is hydrophilic.
42. The method of item 40, wherein the suspension liquid is a non-polar or mildly non-polar solvent, when the coating is hydrophobic.
43. The method of any one of items 40 to 42, wherein in step (c'), the ash is dispersed using ultrasounds.
44. The method of any one of items 40 to 43 further comprising after step (c'''), the step of:
   (d) drying the supernatant to obtain the coated nanoparticles in powder form.
45. Coated nanoparticles produced by the method of any one of items 34 to 44.
46. Coated ash nanoparticles produced by the method of any one of items 34 to 44.

DETAILED DESCRIPTION OF THE INVENTION

Figure 1:
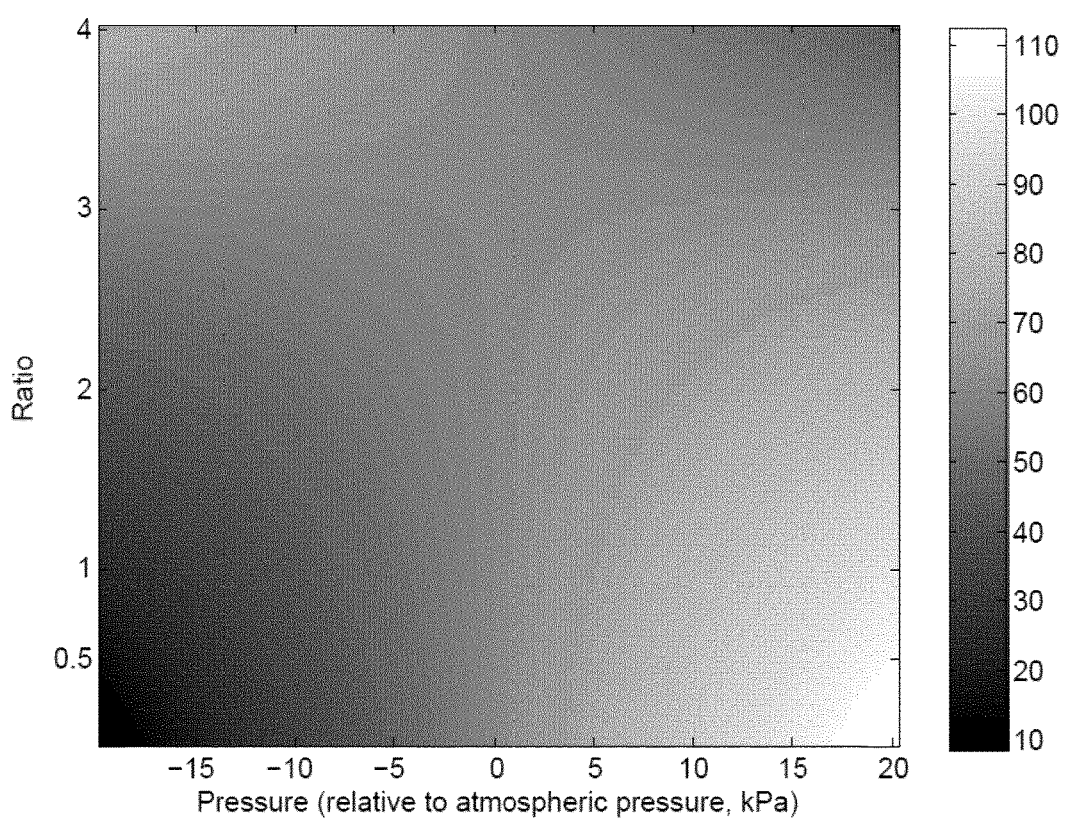
FIG. 1 show the contact angle (shades of grey) as a function of the pressure in the reactor and the $H_2/CO$ ratio.

PICVD Coating at High Pressure with a Gas Precursor of Low Absorption Cross Section Turning now to the invention in more details, in a first aspect of the invention, there is provided a method for producing a coating on a substrate, the method comprising the steps of: (A) introducing the substrate in a photo-initiated chemical vapor deposition reactor, (B) introducing a gas precursor in the reactor so that the pressure in the reactor is between about 0.75 and 1.25 atm, and (C) irradiating said gas precursor with MUV radiation at a given wavelength, thereby at least partly photodissociating the gas precursor, until the coating is formed, the gas precursor having an absorption cross section of about $5 \times 10^{-16}$ cm$^2$/molecule or less at said given wavelength.

Herein, "MUV" radiation refers to "Middle Ultraviolet" or "middle UV", that is radiation having a wavelength between 200 and 300 nm.

As discussed above, in photo-initiated chemical vapor deposition (PICVD), it is customary to specifically target certain molecular bonds in the gas precursor to break them. To do so, it is necessary to use a light source emitting radiation close to the peak absorption of the gas precursor. In other words, the gas precursor must have a large absorption cross section (larger than $5 \times 10^{-16}$ cm$^2$/molecule) at the wavelength of the MUV irradiation used.

The absorption cross section is a measure of the probability of an absorption process. It represents the ability of a molecule to absorb a photon of a particular wavelength. The Beer-Lambert Law for gases expresses the absorbance of a gas at a given wavelength (A') as a function of the absorption cross section at that wavelength (α), the path length (l) and density of the gas molecules (N, for example expressed as a number of molecules per cubic centimeter) as follows:

$$A' = \alpha l N$$

In PICVD, the gas precursor absorbs the MUV radiation. This causes the photodissociation (photolysis) of the gas precursor molecules and produces radicals (or ions). These radicals are very reactive and, when they contact the substrate, will react (photopolymerize) to form a coating on it. The more gas precursor molecules are present in the reactor (i.e. the higher the pressure in the reactor), the higher the likelihood of a newly formed radical encountering and reacting with another gas precursor molecule or another radical rather than reacting with the surface of the substrate to be coated. Therefore, it is common knowledge to conduct PICVD at low pressures (i.e. a few Torrs or less) to ease coating formation. If higher pressures were to be used, it would appear necessary to the skilled person to generate more radicals to produce the desired coatings. In other words, at higher pressures, higher absorption of the radiation by the gas precursor molecules is needed, which means that the absorption cross section of the gas precursor must be higher than when the PICVD is conducted at lower pressures.

This aspect of the invention is based on the inventors' surprising finding that a coating can be effectively produced on a substrate at high pressure even if the gas precursor has a relatively low absorption cross section at the wavelength of the MUV radiation used. It should be noted that this can be achieved without using a photosensitizer/photoinitiator. Therefore, in embodiments of the methods of the invention, the irradiation is carried out in the absence of a photosensitizer/photoinitiator.

The nature of the substrate to be coated is not crucial. The substrate may for example present a metallic surface, an organic surface, a quartz surface, an oxide surface, or a polymeric surface. Furthermore, the substrate may be macroscopic (reactors surfaces, textiles, polymeric nets, bottles, wafers and the like). For example, in such embodiments, the substrate surface may be made of copper, steel, $TiO_2$, ZnO, or wood. The substrate may also be particulate (in the form of particles). This would include powders and nanomaterials (such as nanoparticles, nanotubes, etc.). In one such embodiment, the substrate is ash. The ash can be of various natures (e.g. resulting from incineration of e.g. municipal solid waste, gasification of waste, or other sources). Ash naturally comprises nanoparticles, which once coated according to the present invention, can be more easily isolated and used as described in more details below.

The photo-initiated chemical vapor deposition reactor to be used is not restricted in form or material. It should comprise a chamber to hold the substrate and contain the gas precursor at a given temperature and pressure. This chamber should be provided with appropriate gas inlet(s) and outlet(s) as well as with a means to introduce and remove the substrate. Further, at least part of the chamber should be transparent to MUV radiation at the wavelength used to allow for irradiation of the gas precursor molecules. Alternatively, the chamber should be designed such that light source may be installed within it. In embodiments, the chamber is a quartz tube. In embodiments, the reactor comprise a temperature regulating system to maintain the substrate at a desired temperature, which may be different from, for example lower than, the temperature in the chamber. In embodiments, for example when the substrate is in the form of particles, it may advantageous to hold the particles in a fluidized state during irradiation, which would favor the deposition of a uniform coating. Therefore, the reactor may be configured for fluidization or simply be a fluidized bed reactor.

Finally, the reactor should be provided with a light source emitting MUV radiation at a proper wavelength, i.e. a MUV lamp. This means that the main emission peak (the emission peak with the highest intensity) of this light source should be in the MUV range. In addition, the light source may emit light at other wavelengths. However, these other wavelengths do not correspond to wavelengths where the gas precursor has an absorption cross section of more than about $5 \times 10^{-16}$ cm$^2$/molecule.

In embodiments, the light source is a germicidal lamp, such as a low pressure germicidal lamp. Low pressure germicidal lamps are a common type of germicidal lamp. They generally are similar in appearance to ordinary fluorescent lamps, but the tube contains no fluorescent phosphor. In addition, rather than being made of ordinary borosilicate glass, the tube is made of fused quartz. These two changes combine to allow the 253.7 nm ultraviolet light produced by a mercury arc to pass out of the lamp unmodified (whereas, in common fluorescent lamps, this UV light causes the phosphor to fluoresce, producing visible light). Germicidal lamps produce MUV radiation at a wavelength of 253.7 nm (commonly rounded to 254 nm), and often have a secondary emission peak at 185 nm. Therefore, in embodiments, the wavelength used in the above method is 253.7 nm or about 254 nm. In this particular regard, the method of the invention differs significantly from the high-energy, low-wavelength light sources typically used. Indeed, high-wavelength commercial anti-microbial lamps or such MUV light sources have never been used to promote surface functionalization. Such sources are not used because of the established belief in the field of CVD that photo-stimulated coating and functionalization processes can only occur if the selected precursor compounds have high absorbance (absorption cross section) at the retained wavelengths. Indeed, most organic compounds have poor absorbance at 253.7 nm, thus bond-breaking efficiency is fairly low and deposition kinetics are decreased. Nonetheless, it has been found possible, by the present inventors, to use MUV to generate reactive radicals or ions that can be used for surface functionalization, though at a reduced rate with respect to more energetic sources, but still at as reasonable and useful rate.

In the method of the invention, the pressure in the reactor is between about 0.75 and about 1.25 atm. In embodiments, this pressure is about 0.75, 0.8, 0.85, 0.90, 0.95, or 1 atm or more and/or 1.25, 1.20, 1.15, 1.10, 1.05 or 1 atm or less.

As explained above, the gas precursor has a relatively low absorption cross section (about $5\times10^{-16}$ cm$^2$/molecule or less). In embodiment, the absorption cross section is of about $3\times10^{-16}$ cm$^2$/molecule or less, about $1\times10^{-16}$ cm$^2$/molecule or less, about $7\times10^{-17}$ cm$^2$/molecule or less, about $5\times10^{-17}$ cm$^2$/molecule or less, or about $2\times10^{-17}$ cm$^2$/molecule or less. Apart from that, the nature of the gas precursor is variable. There is no lower limit for the absorption cross section, although it should be understood that the irradiation time required to form a coating of a given thickness is inversely proportional to the absorption cross section.

In embodiments, the gas precursor is an organic gas, ammonia, hydrogen, nitrogen, oxygen, carbon dioxide, or carbon monoxide, or a mixture thereof. Herein, an "organic gas" is a gaseous chemical compound whose molecules contain one or more carbon atoms, excluding carbon-containing carbides, carbonates, simple oxides (CO and $CO_2$), and cyanides, as well as the allotropes of carbon (e.g. diamond and graphite).

In embodiments, the organic gas is as defined above, but is free of metal atoms (such as Si, Cu, Al, etc.).

In embodiments, the gas precursor is a $C_{1-12}$-alcohol (such as methanol, ethanol, propanol, butanol, glycerol, phenol), a $C_{1-12}$-alkane (such as methane, ethane, propane, butane, pentane, hexane, heptane), a $C_{1-12}$-alkene (such as ethylene), a $C_{1-12}$-alkyne (such as acetylene), acetic acid, acetone, acrylic acid, ammonia, carbon dioxide, carbon monoxide, ethylene glycol (including oligomers and polymers thereof), formaldehyde, hydrogen ($H_2$), methanal, methyl methacrylate, nitrogen, a nitrogen oxide, oxygen, ozone, hydrogen peroxide, a sulfur oxide, water, or a mixture thereof.

In embodiments, the gas precursor is a mixture of carbon monoxide and hydrogen, including syngas (see below for more details).

The gas precursor is irradiated with MUV radiation. This irradiation is to be carried out until enough molecules of the gas precursor have been photodissociated (or at least partly photodissociated) and have reacted (photopolymerized) with the substrate to form the desired coating.

As stated above, in embodiments, irradiation can only partly photodissociates gas precursor molecules. Herein, partial photodissociation refers to the breaking of at least one of the constituents bonds of the gas precursor molecules. Such partial photodissociation produces reactive species that can react with other gas precursor molecules and cause their dissociation. All these reactive species can then react (photopolymerize) with the substrate to form the desired coating.

The exact irradiation time needed for each coating will depend on the thickness of coating desired, the extent of surface coverage desired, the absorption cross section of the precursor at the irradiation wavelength, the flow rate and pressure of the gas precursor(s), the temperature of the gas precursor and of the substrate, and the power of the light source used. Step (c) should thus be understood as lasting until a coating of the desired coverage and thickness is obtained.

In embodiments, the gas precursor in the reactor and the substrate are at room temperature.

Increased gas temperature beneficially speeds photodissociation rates. Therefore, in embodiments, the gas precursor temperature is controlled, for example at a temperature of between about 5 and about 80° C., preferably at about room temperature or above room temperature, for example between about 20 and about 70° C., such as between 30 and 50° C. This can be achieved by recuperating the heat emitted by the MUV lamp (when applicable) or by any other means known to the skilled person. In embodiments, the substrate can be at a temperature between about 5 and about 80° C., such as between about 20 and about 80° C., preferably between about 20 and about 30° C.

Increased substrate temperature also increases reaction kinetics. However, the desorption rate may also undesirably be increased. The temperature of the substrate can be adjusted depending on the exact reactions at play. Therefore, the substrate may be at the same temperature, hotter, or cooler than the gas precursor. This can be achieved using, for example, a temperature regulating system, such as a water circulation system placed near the support holder.

The method of this aspect of the invention is very versatile. It can be used to impart various surface functionalities to various types of substrates. It is applicable to any surface, including nanomaterials.

The method is quite simple and inexpensive. For example, it uses relatively affordable equipment. Indeed, no high vacuum equipment is needed. In some embodiments, no heat is required as the coating can be produced at room temperature. This could open the field of gas-phase surface modification to industries that could benefit from thin films, but could not historically benefit from expensive conventional CVD techniques The method shows significant potential for:
  the growth of thin, tailored surface coatings at atmospheric pressure and low temperature with a wide range of possible functionalities;

the solvent-free formation of multi-functional surfaces; and the functionalization of powders and nanoparticles at much larger scales than is currently possible.

With regard to the use of MUV light, it should be noted that it has many advantages:

MUV light can be transmitted readily through common materials such as quartz;

it has little to no absorbance in air, and does not generate significant quantities of ozone; and MUV lamps (in particular low pressure germicidal lamps) are cheap and commercially available, requiring no specialized equipment beyond standard lighting ballasts.

PICVD Coating of Carbon Monoxide and Hydrogen Mixtures

In a second aspect, the present invention provides a method for producing a coating on a substrate, the method comprising the steps of (A) introducing the substrate in a photo-initiated chemical vapor deposition reactor, (B) introducing carbon monoxide (CO) and hydrogen (H2), as gas precursors, in the reactor, and (C) irradiating said gas precursors with UVC radiation, thereby at least partly photodissociating the carbon monoxide, until the coating is formed.

When the wavelength of the UVC radiation is such that the carbon monoxide and the hydrogen both have a low absorption cross section (i.e. about $5 \times 10^{-16}$ cm2/molecule or less) and when the pressure in the reactor is between about 0.75 and 1.25 atm, this method is an embodiment of the method described as the first aspect of the invention. This is the case when the UVC radiation used has a wavelength of about 254 nm (corresponding to that emitted by a low pressure germicidal lamp). However, the method of the second aspect of the invention is not so limited and can be carried out at all UVC wavelengths and at other pressures, in particular smaller pressures.

Herein, "UVC" radiation refers to UV radiation of subtype C, that is, UV radiation having a wavelength between 10 and 300 nm (including the middle, the far and the extreme UV).

This aspect of the invention is based on the inventors' finding that a mixture comprising carbon monoxide and hydrogen could surprisingly be used to produce coatings exhibiting a wide range of hydrophilicity (and conversely hydrophobicity). As will be seen below, the exact properties of the coating depend on a few process parameters.

The gas precursors can be introduced separately or in admixture in the reactor. In embodiments of this method, the gas precursor is a mixture of carbon monoxide and hydrogen only. In embodiments, the gas precursor is syngas, which may comprise others components, such as carbon dioxide.

The nature of the substrate to be coated is not crucial. The substrate may for example present a metallic surface, an organic surface, a quartz surface, an oxide surface or a polymeric surface. Furthermore, the substrate may be macroscopic (reactors surfaces, textiles, polymeric nets, bottles, wafers and the like). For example, in such embodiments, the substrate may be made of copper, steel, TiO2, ZnO, or wood. The substrate may be particulate. This would include powders and nanomaterials (such as nanoparticles, nanotubes, etc.). In one such embodiment, the substrate is ash. The ash can be of various natures (e.g. resulting from incineration of e.g. municipal solid waste, gasification of waste, or other sources). Ash naturally comprises nanoparticles, which once coated according to the present invention, can be more easily isolated and used as described in more details below.

The photo-initiated chemical vapor deposition reactor to be used is not restricted in form or material. It should comprise a chamber to hold the substrate and contain the gas precursors at a given pressure. This chamber should be provided with appropriate gas inlet(s) and outlet(s) as well as with a means to introduce and remove the substrate. Further, at least part of the chamber should be transparent to UVC radiation at the wavelength used to allow for irradiation of the gas precursor molecules. In embodiments, the chamber is a quartz tube. In embodiments, the reactor comprise a temperature regulating system to maintain the substrate at a desired temperature, which may be different from, for example lower than, the temperature in the chamber. In embodiments, for example when the substrate is in the form of particles, it may advantageous to hold the particles in a fluidized state during irradiation, which would favor the deposition of a uniform coating. Therefore, the reactor may be configured for fluidization or simply be a fluidized bed reactor.

Finally, the reactor should be provided with a light source emitting UVC radiation at a proper wavelength, that is a UVC lamp. This means that the main emission peak (the emission peak with the highest intensity) of this light source should be in the UVC range. In addition, the light source may emit light at other wavelengths.

In embodiment, the main emission peak of the light source is between about 100 nm and about 300 nm, for example, between about 120 nm and about 260 nm. In embodiments, the light source is a xenon lamp (147 nm), a krypton lamp (123 nm), an excimer xenon lamp (172 nm), a deuterium hydrogen lamp (160 nm) or a germicidal lamp, such as a low pressure germicidal lamp (253.7 nm often with a secondary emission peak at 185 nm).

The gas precursors are irradiated with UVC radiation. This irradiation is to be carried out until enough molecules of the carbon monoxide have been partly photodissociated and have reacted with the hydrogen and with the substrate to form the desired coating.

As stated above, this irradiation partly photodissociates carbon monoxide molecules. Herein, partial photodissociation of carbon monoxide refers to the breaking of at least one of its constituents pi bonds. Partial photodissociation of the carbon monoxide produces reactive species that can react with other molecules of hydrogen and carbon monoxide and cause their dissociation. The reactive species of both precursors can then react (photopolymerize) with the substrate to form the desired coating. It is not necessary that both carbon monoxide (CO) and hydrogen (H2) be partly or fully photodissociated by the MUV radiation.

The exact irradiation time needed for each coating will depend on the thickness of coating desired, the extent of surface coverage desired, the absorption cross section, the flow rates and pressure of the gas precursors, the temperature of the gas precursors and of the substrate, and the power of the light source used. Step (c) should thus be understood as lasting until a coating of the desired coverage and thickness is obtained.

In embodiments, the irradiation is carried out in the absence of a photosensitizer/photoinitiator.

In other embodiments, a photosensitizer/photoinitiator can be introduced in the reactor, if desired, to speed photodissociation. Examples of photosensitizers/photoinitiators include H2O2 (commonly known as hydrogen peroxide), ethyl-2,4,6-trimethylbenzoylphenylphosphinate (TPO-L from BASF), 2,2'-azobis(2-methylpropane) (ABMP), benzophenone and its derivatives, and Michler's Ketone (MK). In such embodiments, the photosensitizer/photoinitiator can be introduced into the reactor for example by bubbling either of both the gas precursors in it, or through the use of a syringe pump or other dosing method.

In embodiments, the carbon monoxide and the hydrogen in the reactor and the substrate are at room temperature.

Increased gas temperature beneficially speeds photodissociation. Therefore, in embodiments, the gas precursor temperature is controlled, for example at a temperature of between about 5 and about 80° C., preferably at about room temperature or above room temperature, for example between about 20 and about 70° C., such as between 30 and 50° C. This can be achieved by recuperating the heat emitted by the MUV lamp (when applicable) or by any other means known to the skilled person.

Increased substrate temperature also increases reaction kinetics. However, the desorption rate may also undesirably be increased. Therefore, in embodiments, the substrate is at the same temperature or cooler than the gas precursor. This can be achieved using, for example, a temperature regulating system, such as a water circulation system placed near the support holder. In embodiments, when producing a hydrophilic coating, the substrate can be at a temperature between about 5 and about 80° C., such as between about 20 and about 80° C., preferably between about 20 and about 30° C.

As stated above, the wettability of the coating produce can be tailored to be hydrophilic (with a contact angle with water of less than 90°) to hydrophobic (with a contact angle with water of more than 90°) by adjusting certain process parameters. These parameters are the pressure of the gas precursor in the reactor, the H2/CO ratio, and the position of the substrate in the reactor.

The influence of the position in the reactor will depend on reactor design. It will simply be noted here that more hydrophilic coatings tend to be produced closer to the gas precursor inlet, while more hydrophobic coatings tend to be produced farther from the inlet.

In embodiments, the pressure in the reactor is between about 0.75 and about 1.25 atm. In embodiments, this pressure is about 0.75, 0.8, 0.85, 0.90, 0.95, or 1 atm or more and/or 1.25, 1.20, 1.15, 1.10, 1.05 or 1 atm or less. In other embodiments, the pressure in the reactor is lower than 0.75 atm.

In embodiments, the H2/CO ratio varies between about 1/16 to about 4. It can be for example, 1/16, 1/8, 1/4, 1/2, 1, 2, 3, or 4.

Figure 17:
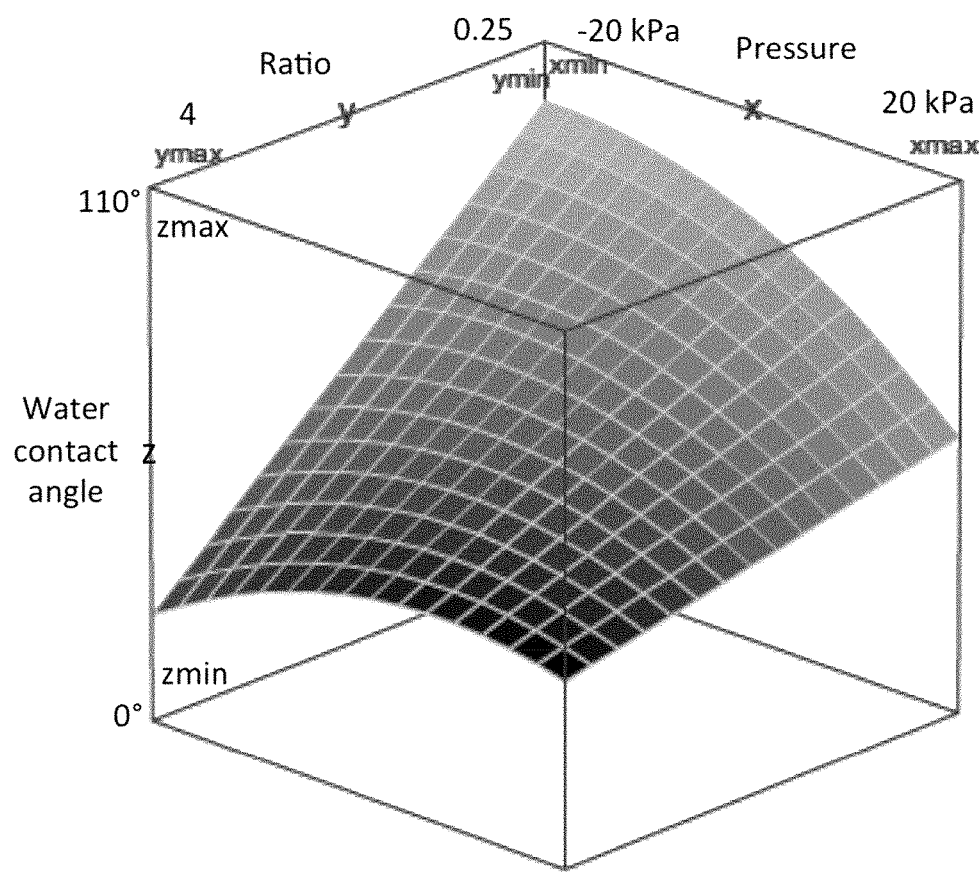
FIG. 17 is a 3D representation of the empirical model where x axis represents the pressure in the reactor, y the gas ratio and z the water contact angle obtained for a fixed position value of 4 (definition of the axes: $x_{min}=-20$ kPa; $x_{max}=20$ kPa; $y_{min}=0.25$; $y_{max}=4$; $z_{min}=0°$; $z_{max}=110°$)

FIGS. 1 and 17 show the calculated contact angle (shades of grey) as a function of the pressure in the reactor and the H2/CO ratio. The contact angles were calculated using the models discussed below for an average position in the reactor, that is one at which both hydrophilic and hydrophobic coatings can be produced (more specifically positions 6 and 4 discussed at Example 1 and 3 below, respectively). Therefore, the pressure and the H2/CO ratio can be selected so as to tailor the properties of the coating produced. It is to be understood that the exact contact angle produced for a given set of parameters may vary from a PIVCD setup to another. However, FIGS. 1 and 17 provide trends to be used to set the process parameters.

In embodiments, hydrophilic coatings are preferred when the substrate is ash. In other embodiments, hydrophobic coatings are preferred when the substrate is ash. The choice of a hydrophilic or hydrophobic coating will depend on the further processing of the coated ash. If suspension in water or hydrophilic liquid is desired, a hydrophilic coating will be preferred and conversely.

The method of this aspect of the invention is very versatile as it is applicable to any surface, including nanomaterials.

The method is quite simple and inexpensive. For example, it uses relatively affordable equipment. Indeed, when carrying out deposition around normal pressure, no high vacuum equipment is needed. In some embodiments, no heat is required as the coating can be produced at room temperature. This could open the field of gas-phase surface modification to industries that could benefit from thin films, but could not historically benefit from traditionally expensive CVD techniques.

This method also offers possibilities for the valorisation of syngas, which instead of being burned can be used as a raw material to produce value added materials.

Substrate with Hydrophilic or Hydrophobic Carbon Polymer Coating

In third aspect, the present invention provides a material produced through the method described in the second aspect of the invention.

This material is thus a substrate (of various natures) with a carbon polymer coating. It is believed that this carbon polymer could have a chemical structure akin to phenolic resin or Fisher-Tropsch waxes.

This coating can be hydrophilic (having a contact angle with water of 90° or less) or hydrophobic (having a contact angle with water of 90° or more). In fact, the surface wettability of this coating can be tailored from hydrophilic to hydrophobic by varying the process parameters as explained above.

It should be noted that after being coating, the material still has the mechanical properties of the substrate, but has advantageously gained different surface properties, which makes it a value added material.

Coating of Ash Nanoparticles

The present inventors have found that nanomaterials, such as nanoparticles can be successfully coated using the above coating methods, preferably that according to the second aspect of the present invention described above. Therefore, in a fourth aspect, the present invention provides a method of coating nanoparticles comprising carrying the coating method according to either the first or second aspect of the invention above as described above. In an embodiment, the present invention provides a method of coating nanoparticles comprising carrying the coating method according to the above second aspect of the invention to produce a coating on the nanoparticles.

As noted above, it is advantageous that the particles be held in a fluidized state during irradiation, which would favor the deposition of a uniform coating. Therefore, the reactor may be configured for fluidization or simply be a fluidized bed reactor.

The nanoparticles and nanomaterials to be coated are not restricted in nature. Herein, "nanomaterials" (including nanoparticles) are materials (particles) with a least one spatial dimension smaller than 100 nm. The particles may be present individually or as aggregates of a larger size.

Due to their high surface tension, nanoparticles and nanomaterials tend to aggregate thereby producing structures that are larger than needed for many applications. Conventionally, to overcome this problem, the surface of the nanoparticles is functionalized (using surfactants or covalent bonding), which consists in treating the surface by adding functional groups. The present method allows functionalizing (coating) the nanoparticles/nanomaterials. In further embodiments, it also allows isolating these coated nanoparticles and nanomaterials taking advantage of the interaction between the coating and the environment, for example using a hydrophilic coating to ease dispersion in water or a polar solvent.

The coating of the nanoparticles/nanomaterials can be carried out in batch or continuously.

In a specific embodiment, the nanoparticles/nanomaterials coated by the present method can be the nanoparticles naturally found in ash (where they are combined with other bigger particles). The ash can be of various sources (e.g. resulting from incineration of e.g. municipal solid waste, gasification of waste, or other sources). Ash comprises nanoparticles, which once coated according to the present invention, can be more easily isolated and used. When coating ash, the ash (complete with the bigger particles) is subjected to the coating method according to the first or second aspect of the invention. Then, the coated nanoparticles can be isolated from the (now coated) bigger particles by known methods. For example, this can be accomplished by dispersing (for example using ultrasounds) the coated ash in a suspension liquid (e.g. a polar liquid, such as water, when the coating is hydrophilic or a non-polar or mildly non-polar solvent, such as acetone, when the coating is hydrophobic), allowing the bigger particles to settle and a supernatant containing the nanoparticles to form, separating the supernatant from the settled solids. The nanoparticles can be used as such (in suspension); or the supernatant can be dried to obtain the coated nanoparticles in powder form.

This technique for recycling such waste materials MSW ash and extract therefrom useful nanoparticles could have a significant impact in waste management, pollution control as well as low-cost production of valuable materials. Given the massive scale production of ash and syngas as by-products of several processes, the practical implementation of these two materials for extraction of precious materials like coated functionalized nanoparticles may have a profound impact in several industries such as waste water treatment and construction materials.

The above method allows extracting nanoparticles (more specifically particles with a diameter of less than about 100 nm) from ash. In an aspect, the present invention is also related to ash nanoparticles bearing a coating produced by the above method. The nanoparticles obtained are of various composition and size depending on the exact nature of the starting ash. However, if desired they can be refined for a specific purpose (e.g. nanocomposites). Advantageously, they can also be used in bulk in applications where the physico-chemical characteristics of nanoparticles are not crucial and where the cost of production must be low. One such application is nanofluids, which are suspensions of nanoparticles used for heat transfer.

Generally speaking, the dispersion of nanoparticles in a host liquid (i.e. the production of a "nanofluid") typically increases the overall thermal conductivity of the system by a factor of about 3 relative to the mass content of the particles. This significant increase is conventionally attributed to a higher conductivity of the solid nanoparticles relative to the liquid. However, this improvement in thermal properties usually does not justify the high cost of using nanoparticles. The above low-cost production of nanoparticles via the coating of ash renders the use of nanoparticles in a nanofluid economically more viable. Therefore, in an aspect, the present invention relates to a nanofluid comprising nanoparticles, for example ash nanoparticles, bearing a coating produced by the above method, the nanoparticles being suspended in a suspension liquid. This liquid can be a polar solvent (especially when the coating is hydrophilic) or a non-polar or mildly non-polar solvent (especially when the coating is hydrophobic). In embodiments, the suspension liquid is for example water, ethylene glycol, or oil.

In embodiments, these aspects of the invention can have the following advantages/uses:
- enabling the production of value-added nanoparticles from waste,
- enabling the low-cost production of nanofluids, thus enabling their more wide-spread use, including in solar collectors,
- valorisation of waste (ash), which could be carried out anywhere ash is produced and/or at gasification centers (where syngas is produced),
- easy implementation,
- easy scale-up,
- thermally stable functionalization of nanoparticles, thus allowing their use at high temperatures, and/or
- removal of nanoparticles of ash to avoid unwanted lixiviation in the environment.

Definitions

The use of the terms "a" and an and the and similar referents in the context of describing the invention (especially in the context of the following claims) are to be construed to cover both the singular and the plural, unless otherwise indicated herein or clearly contradicted by context.

The terms "comprising", "having", "including", and "containing" are to be construed as open-ended terms (i.e., meaning "including, but not limited to") unless otherwise noted.

Recitation of ranges of values herein are merely intended to serve as shorthand for referring individually to each separate value falling within the range, unless otherwise indicated herein, and each separate value is incorporated into the specification as if it were individually recited herein. All subsets of values within the ranges are also incorporated into the specification as if they were individually recited herein.

Similarly, lists of elements, for example solvents, serve as shorthand for referring individually to each element and it should be understood that each separate element is incorporated into the specification as if it were individually recited herein. All subsets of elements within the lists are also incorporated into the specification as if they were individually recited herein.

Herein, an "alkane" is a saturated aliphatic hydrocarbon of general formula $C_nH_{2n+2}$. An "alkene" is an aliphatic hydrocarbon similar to an alkane except that it comprises at least one double bond. An "alkyne" is a aliphatic hydrocarbon similar to an alkane except that it comprises at least one triple bond. It is to be noted that, unless otherwise specified, the hydrocarbon chains of these compounds can be linear, branched or cyclic. Further, unless otherwise specified, these groups can contain between 1 and 12 carbon atoms, between 1 and 6 carbon atoms, between 1 and 3 carbon atoms, or contain 1 or 2 carbon atoms.

Herein, an "alcohol" is a saturated or unsaturated aliphatic (linear, branched or cyclic) or aromatic hydrocarbon compound comprising one or more —OH groups, for example two or three such groups. Unless otherwise specified, the alcohol can contain between 1 and 12 carbon atoms, between 1 and 6 carbon atoms, between 1 and 3 carbon atoms, or contain 1 or 2 carbon atoms.

All methods described herein can be performed in any suitable order unless otherwise indicated herein or otherwise clearly contradicted by context.

The use of any and all examples, or exemplary language (e.g., "such as") provided herein, is intended merely to better illuminate the invention and does not pose a limitation on the scope of the invention unless otherwise claimed.

No language in the specification should be construed as indicating any non-claimed element as essential to the practice of the invention.

Herein, the term "about" has its ordinary meaning. In embodiments, it may mean plus or minus 10% or plus or minus 5% of the numerical value qualified.

Unless otherwise defined, all technical and scientific terms used herein have the same meaning as commonly understood by one of ordinary skill in the art to which this invention belongs.

Other objects, advantages and features of the present invention will become more apparent upon reading of the following non-restrictive description of specific embodiments thereof, given by way of example only with reference to the accompanying drawings.

DESCRIPTION OF ILLUSTRATIVE EMBODIMENT

The present invention is illustrated in further details by the following non-limiting examples.

Example 1—Hydrophilic and Hydrophobic Coatings Prepared by PICVD of Syngas

We describe herein the coating of high quality hydrophilic and hydrophobic deposits on flat copper substrates by photo-initiated chemical vapour deposition (PICVD). The monomers used for the photopolymerization consisted of a mixture of hydrogen ($H_2$) and carbon monoxide (CO), which is commonly called syngas.

Experimental

Figure 2:
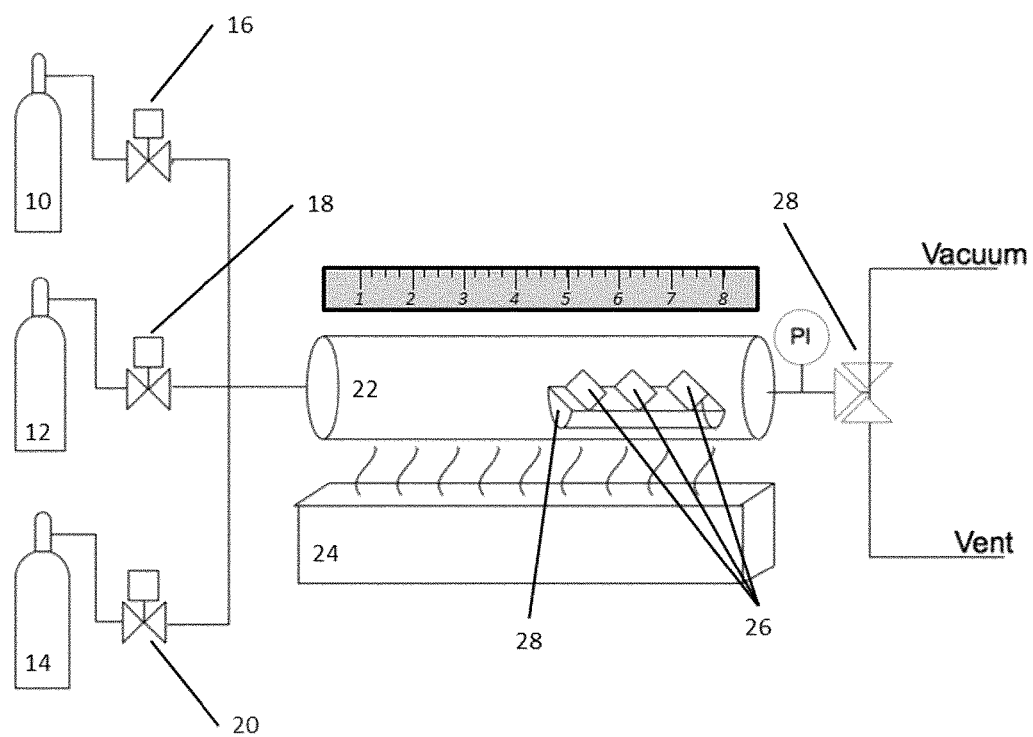
FIG. 2 is a schematic of the PICVD setup used.

FIG. 2 shows a schematic of the PICVD setup used.

$H_2$ and CO were supplied in gas bottles (10 and 12) and the gas ratio was controlled by adjusting each gas individual massflow controller (16, 18). Argon for flushing the reactor as needed was also supplied in a gas bottle (14) fitter with a massflow controller (20). The gas mixture was fed to a quartz tubular reactor (22) which was partially transparent to UV in the 254 nm range. The reactor was made of two quartz tubes joined end to end and custom built with standard 11/40 taper joints. The joints were sealed using standard laboratory grease. All experiments were conducted using a dual-bulb 254 nm UV germicidal lamp (24) 1.5 m wide. The experiments duration was fixed to 1 hour.

Flat copper substrates (26) of 1.5 cm per 1 cm were used for all experiments and the substrate holder (28) could hold 5 such substrates at a time (only three of which are shown in FIG. 2 for clarity). The position of the substrates in the reactor was noted using integers ranging from 1, which was the position closest to the end of the reactor where the gas entry was located (on the left in FIG. 2), to 8, which was closest to the other end of the reactor (on the right in FIG. 2). These positions are indicated on the grey ruler (not part of the actual PICVD setup) in FIG. 2. In this figure, substrates (26) from left to right are shown at about positions 5, 6, 7, respectively.

The temperature inside the reactor was taken through an IR temperature measurement with an emissivity factor of 0.75. The operating the pressure in the reactor was controlled via a 3-way valve (28) placed at the output by dosing the constriction. One of the two outputs of the valve was linked to a vacuum line, while the other led to a vent. This configuration allowed obtaining pressures ranging from −20 kPa to +10 kPa gauge (relative to atmospheric pressure).

Once coated, the copper substrates were analyzed by goniometry to measure their wettability. More specifically, the contact angle formed by a drop of water was measured (conditions=1 min, 5 points). Some coatings where also observed by SEM.

The effects of the following parameters have been tested in 1 hour duration experiments and statistically analysed:
 $H_2$/CO molar (or volume) ratio (varying from 1/16 to 4),
 individual and total flowrates (the total flowrate varying from 260 to 1000 mL/min),
 position in the reactor (from 1 to 8),
 pressure in the reactor (expressed as the difference with atmospheric pressure and varying from −20 to +10 kPa),
 delay before analysis (in number of days after deposition of the coating),
 order of experiment (to identify and control for cumulative effects over time, for example lamp degradation), and
 light intensity (increased by partially or totally enclosing the lamp together with the reactor using aluminium paper). NB. This increased temperature in the reactor as well.

For each experiment, 4 samples were held in the reactor at 4 specific positions. The experimental design is shown in Table 1

TABLE 1

| $H_2$/CO ratio | Pressure |
|---|---|
| −1 | −1 |
| 1 | 1 |
| 1 | −1 |
| −1 | 1 |

Results

Table 2 shows the effect of some of the experimental parameters varied on the reaction observed and the coating produced.

TABLE 2

| Parameter | High | Low |
|---|---|---|
| Pressure | High reaction rate | Promote in-depth adsorption |
| Gas precursor temperature | High kinetic rate | Low kinetic rate |
| Substrate temperature | High desorption rate | Low desorption rate |
| Flowrates | High deposition rate | High coating density |

Statistically, the following parameters have been found to have no significant effect on the wettability observed:
 individual and total flowrates,
 light intensity,
 order of experiments, and
 $H_2$/CO ratio (though this parameter had an effect when combined with pressure as explained below).

On the other hand, the following parameters have been found to have a significant effect on the surface properties:
 pressure in the reactor,
 position in the reactor (more hydrophilic towards 1 and more hydrophobic towards 8), and
 delay before analysis.

In view of the effect of the delay before analysis on the surface properties, the surfaces were analyzed on the same day they are produced in order to eliminate uncertainties in the data analysis.

Figure 3:
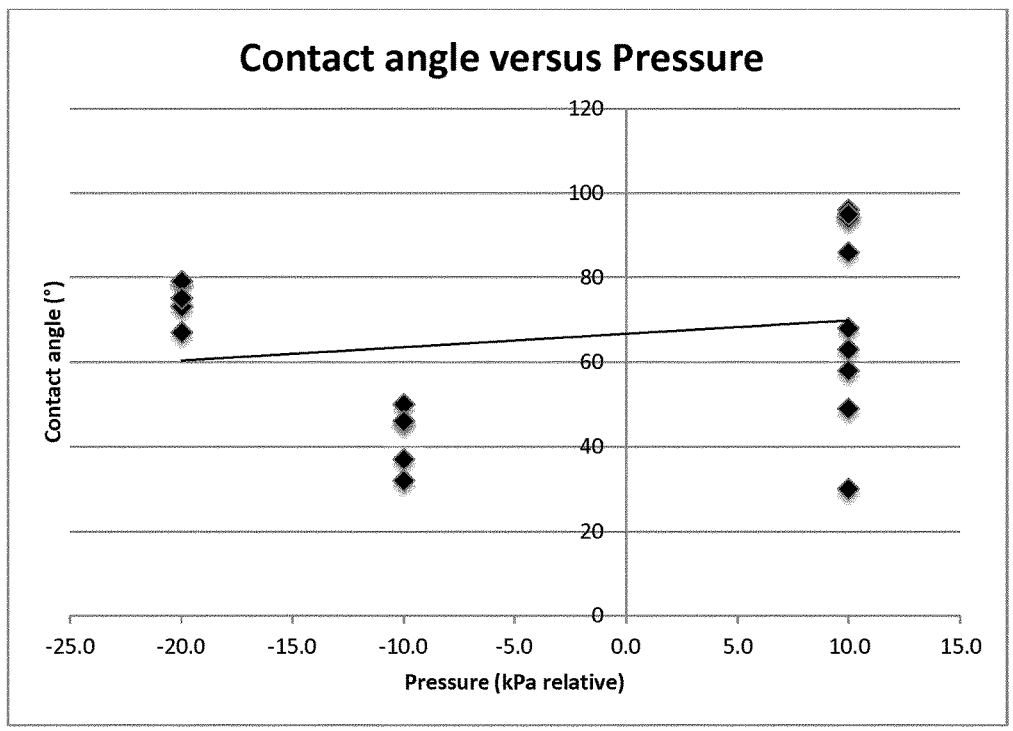
FIG. 3 is a graph of the contact angle measured as a function of the pressure in the reactor.

FIG. 3 shows the influence of the pressure in the reactor on the contact angle measured for a series of experiments at various positions in the reactor.

Figure 4:
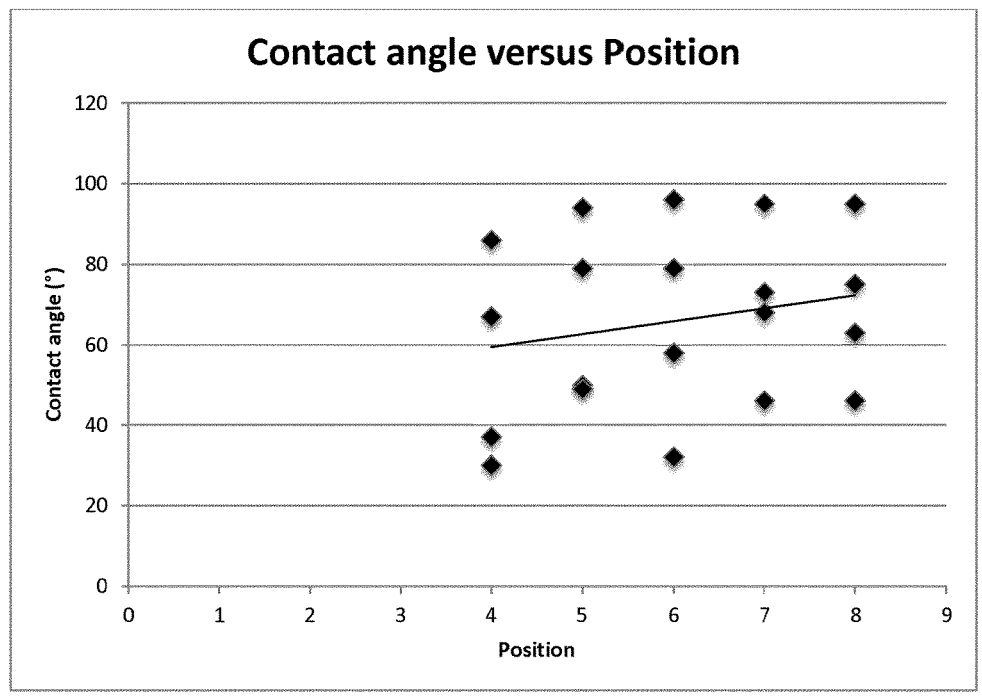
FIG. 4 is a graph of the contact angle measured as a function of the position in the reactor.

FIG. 4 is a graph of the contact angle measured as a function of the position in the reactor for a series of experiments (with various pressures in the reactor).

Finally, it has been found that some parameters have an effect on the surface properties when they are combined (through multiplication of one by the other):

$H_2$/CO Ratio*Pressure, and
Pressure*Position.

Figure 5:
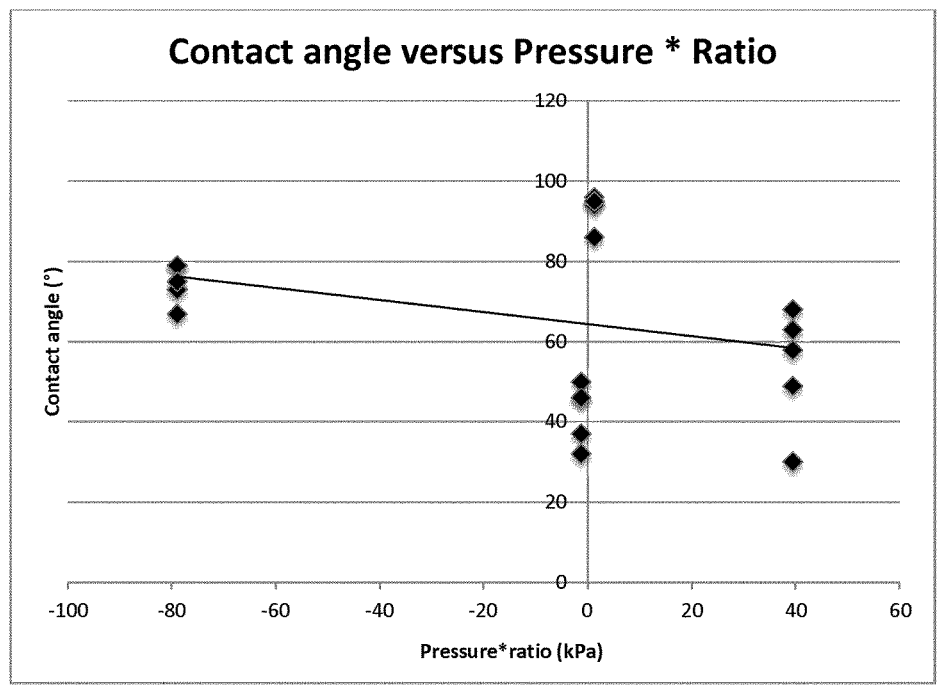
FIG. 5 is a graph of the contact angle measured as a function of the $H_2/CO$ Ratio*Pressure.

FIG. 5 is graph of the contact angle measured as a function of $H_2$/CO ratio*Pressure for a series of experiments at various positions in the reactor.

Figure 6:
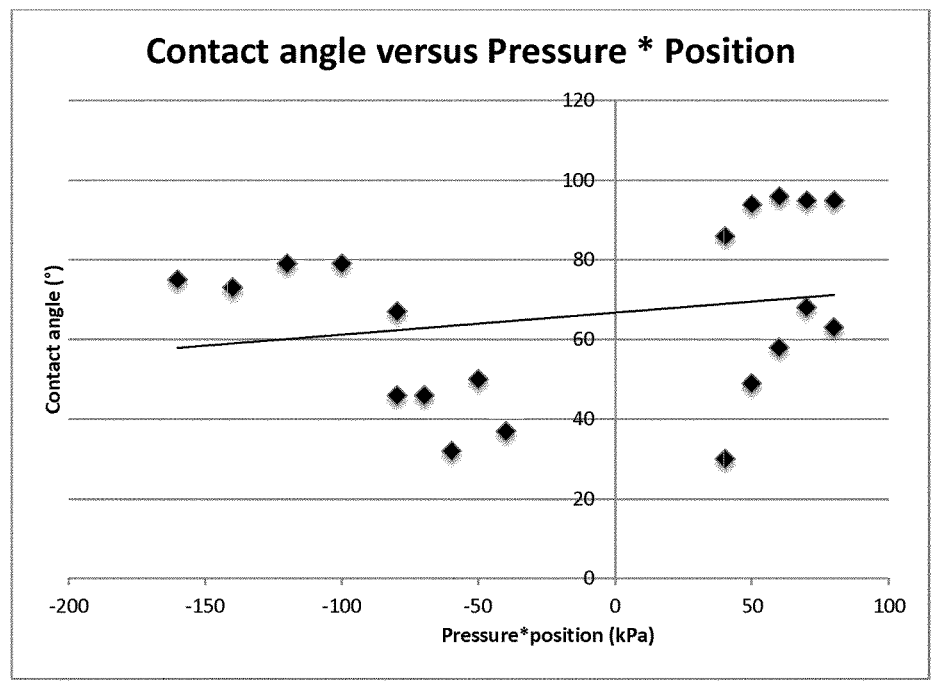
FIG. 6 is a graph of the contact angle measured as a function of the Pressure*Position.

FIG. 6 is graph of the contact angle measured as a function of Pressure*Position for a series of experiments at various $H_2$/CO ratios.

Table 3 summarizes the effect of the above parameters alone and in combination.

TABLE 3

|  | Hydrophilicity | Hydrophobicity |
|---|---|---|
| Pressure* $H_2$/CO Ratio | increased | decreased |
| Position*Pressure | increased | decreased |
| Pressure | decreased | increased |
| Position | decreased | increased |

Using the above setup, contact angles ranging from 30° to 100° have been obtained simply by mapping the experimental conditions. By slightly varying the setup, coatings with contact angles from about 5° to about 110° were obtained.

FIGS. 3 to 6 show no clear tendencies. This is because many parameters were varied simultaneously. Therefore, the above data only make senses when all parameters are considered together. For this reason, a model of the contact angle versus the above parameters has been used to fit the data.

The following empirical model describes the behavior of the PICVD system used by relating contact angle to the above parameters:

Angle(°)=1.75$P$+3.58·pos−0.83$P$·$R$+0.15$P$·pos+39 where:

P is the pressure in the reactor, relative to atmospheric pressure (in kPa),

Pos is the position in the reactor (an integer from 1 to 8), and

R is the $H_2$/CO molar (or volume) ratio (dimensionless).

The correlation coefficient $R^2$ for this model is 0.89 (due to the noise introduced by the different order of magnitude between parameters). A higher coefficient $R^2$(0.91) was obtained for a normalized model.

The above model can predict accurately the contact angle obtained using a given set of experimental parameters and the above experimental, while a simple study of the individual tendencies shown in the figures could not. The position parameter would be expected to vary from one setup to another, but the influence of the pressure and the ratio on the contact angle is expected to follow similar trends independently of the experimental setup.

This model shows that the parameters favoring hydrophobic coatings are higher pressure combined with lower $H_2$/CO ratio, while the opposite favors hydrophilic surfaces.

Figure 7:
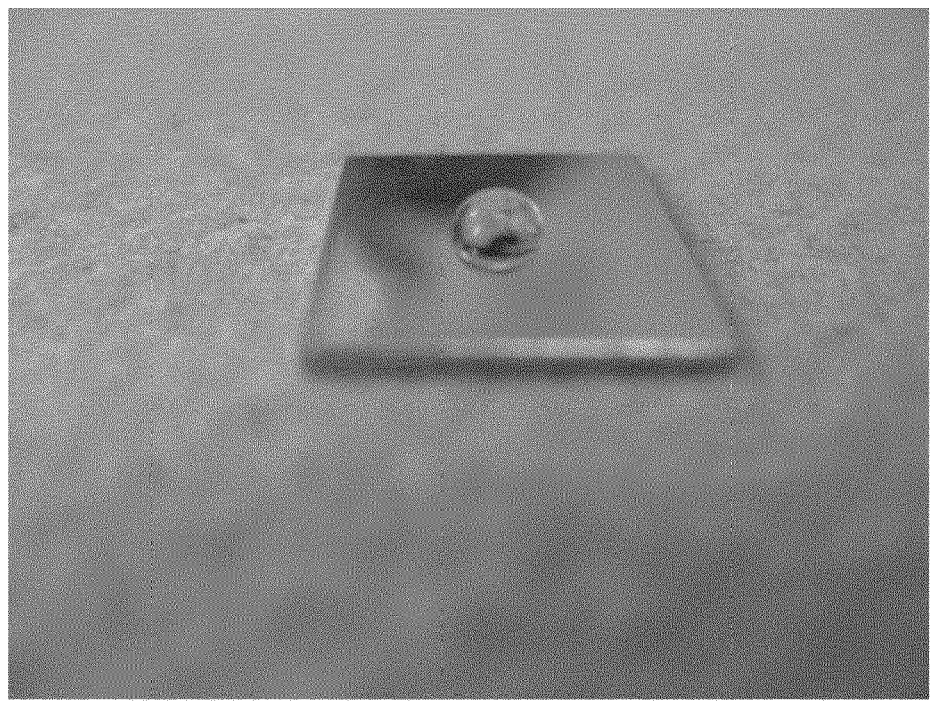
FIG. 7 shows an embodiment of a hydrophobic coating.

FIG. 7 is a picture of one of the hydrophobic coatings produced with a $H_2$/CO Ratio of 1/8, at a pressure 10 kPa above normal pressure, and at position 2 in the reactor. It can be seen that a drop of water on the coating does not spread. The contact angle for this coating was about 95°.

Figure 8:
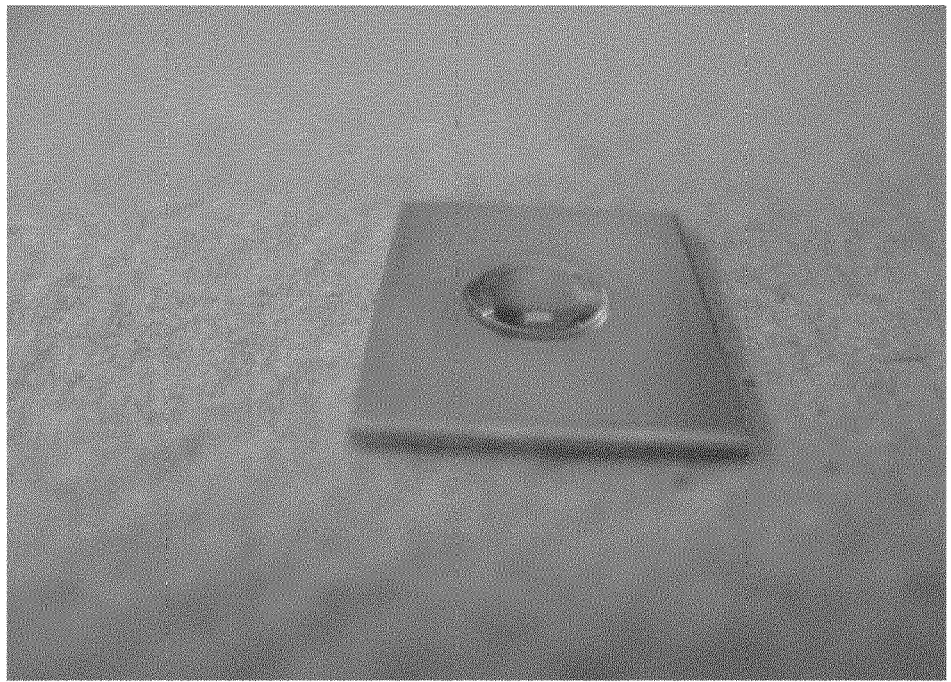
FIG. 8 shows an embodiment of a hydrophilic coating.

FIG. 8 is a picture of one of the hydrophilic coatings produced with a $H_2$/CO Ratio of 1/8, at a pressure 10 kPa below normal pressure, and at position 4 in the reactor. It can be seen that a drop of water on this coating spreads. The contact angle for this coating was about 5°.

It should be mentioned that hydrophobic coatings have been found to be more stable with time than hydrophilic coatings.

Finally, it was observed that increasing the temperature in the reactor by covering part the reactor and the UVC lamp with aluminum paper tended to favor hydrophobic coatings. It also increased the rate of deposition up to a point. Then, when too much of the reactor was covered, the increased desorption lowered the deposition rate to a level below that observed at room temperature (i.e. without aluminum paper). It was observed that a cooling system used to cool the substrate holder countered this effect and increased the deposition rate.

Figure 9:
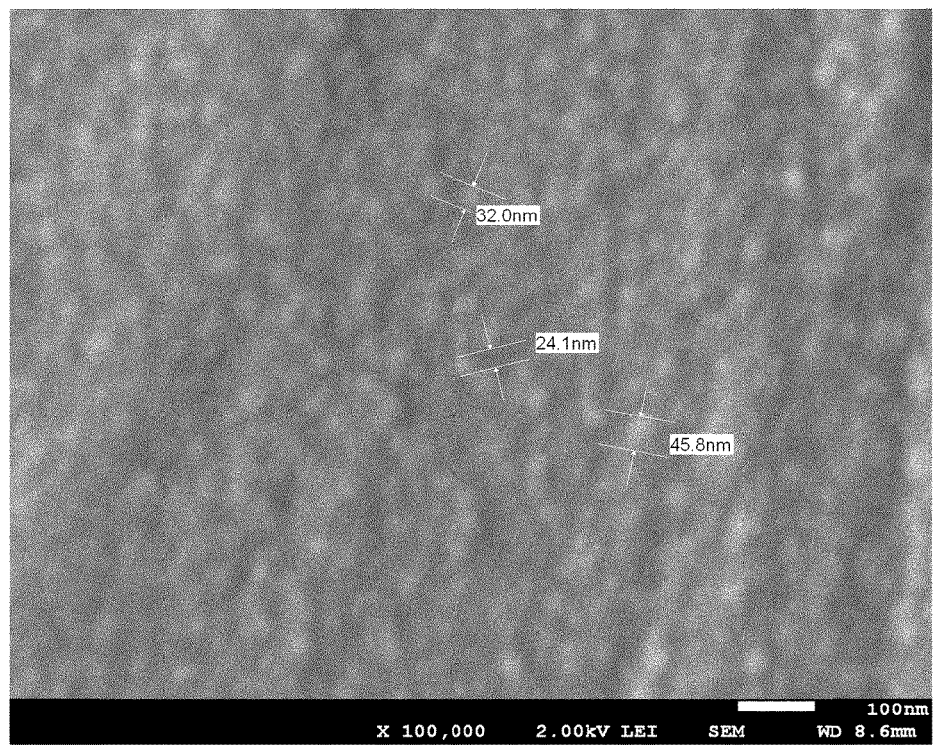
FIG. 9 is a SEM micrograph of a coating according to an embodiment of the invention.

Finally, it has also been observed that some coatings produced under conditions for generating hydrophilic coatings presented red spots. The wettability was at its highest on these red spots. Contact angles as low as 5° were observed. FIG. 9 is a SEM micrograph of such a red spot. The small white circles on the surface are believed to represent nano structures that have been coated on the surface. The average diameter of those circles appears to be in the order of 30 nm. The conductivity of the red spots was very low (127 times lower than copper alone).

Example 2—PICVD Coating of Ash

A total of six (6) experiments with a time run of one (1) hour were made on ash samples. These experiments were carried in a reactor made from two (2) 45 cm long quartz tube with standard 24/40 taper joints. The light source for the PICVD process was a dual-bulb 254 nm UVC germicidal lamps of 96 cm in length, which offered 5.5×10$^{-4}$ W/cm$^2$ of light intensity.

The following steps were followed for each experiment:
1. Make sure the quartz tube are clean;
2. Collect ash sample to be treated and spread it on a holder, in this case a metal spatula;
3. Place the holder at the center of the reactor and make sure there is no leak at the joints;
4. Let the reactant gases flow into the reactor in the ratio for desired surface properties (see operational parameters map in the figures);
5. Set the pressure according to desired target surface properties and open the UVC light;
6. Depending on the experiment, let the gases bubble through peroxide ($H_2O_2$—placed in a bottle at the beginning of the reactor) before entering it—the peroxide is used to accelerate or improve the deposition reaction (photosensitizer/photoinitiator);
7. Transfer the ash into deionized water;
8. Disperse the ash in the water using ultrasound (either ultrasonic probe or bath);
9. Allow the water sample to settle for one day (larger particles will sediment);
10. Separate the supernatant water phase from the settled solids by decantation; and
11. Collect samples from the supernatant and analyze the results with TEM.

The different experimental conditions are summarized in the following table:

TABLE 4

| | # Experiment | | | | | |
|---|---|---|---|---|---|---|
| | 1 | 2 (comparative) | 3 | 4 (comparative) | 5 | 6 |
| CO (mL/min) | 390 | 390 | 390 | 390 | 390 | 390 |
| H$_2$ (mL/min) | 49 | 49 | 49 | 49 | 49 | 49 |
| Relative Pressure (kPa) | 0 | 0 | −10 | 0 | 10 | −10 |
| Temperature (° C.) | 23 | 23 | 23 | 23 | 23 | 23 |
| Time run (h) | 1 | 1 | 1 | 1 | 1 | 1 |
| H$_2$O$_2$ | Yes | Yes | No | No | Yes | Yes |
| UV Lamp | ON | OFF | ON | OFF | ON | ON |

TEM analysis showed a significant presence of nanoparticles in Experiments #1, 3, 5, and 6. In fact, a fair number of nanoparticles were effectively coated in these experiments. TEM images of Experiments #2 and 4 did not show nanoparticles.

Figure 10:
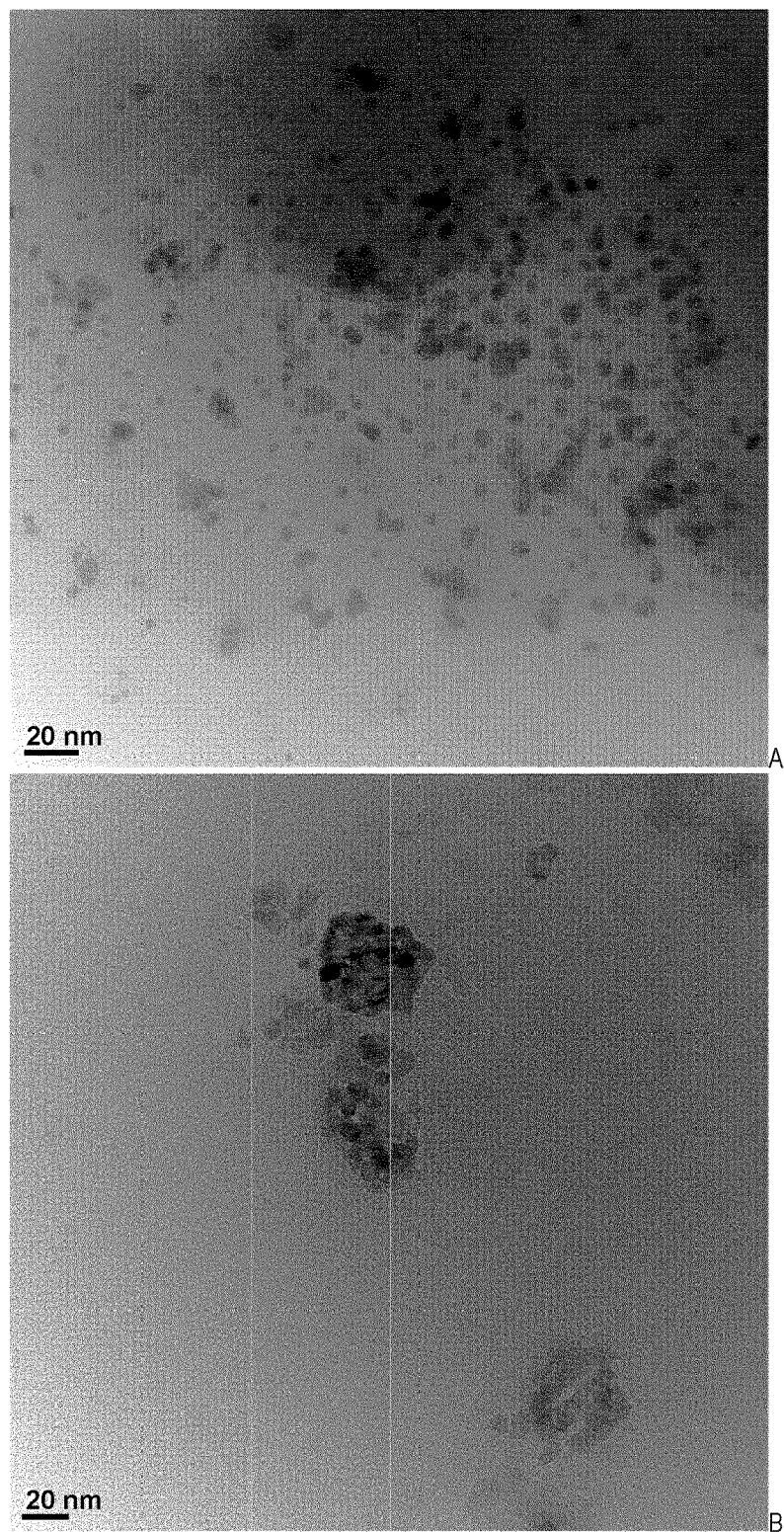
FIG. 10 (A and B) are TEM micrographs of ash treated according to Experiment #1 of Example 2.
Figure 11:
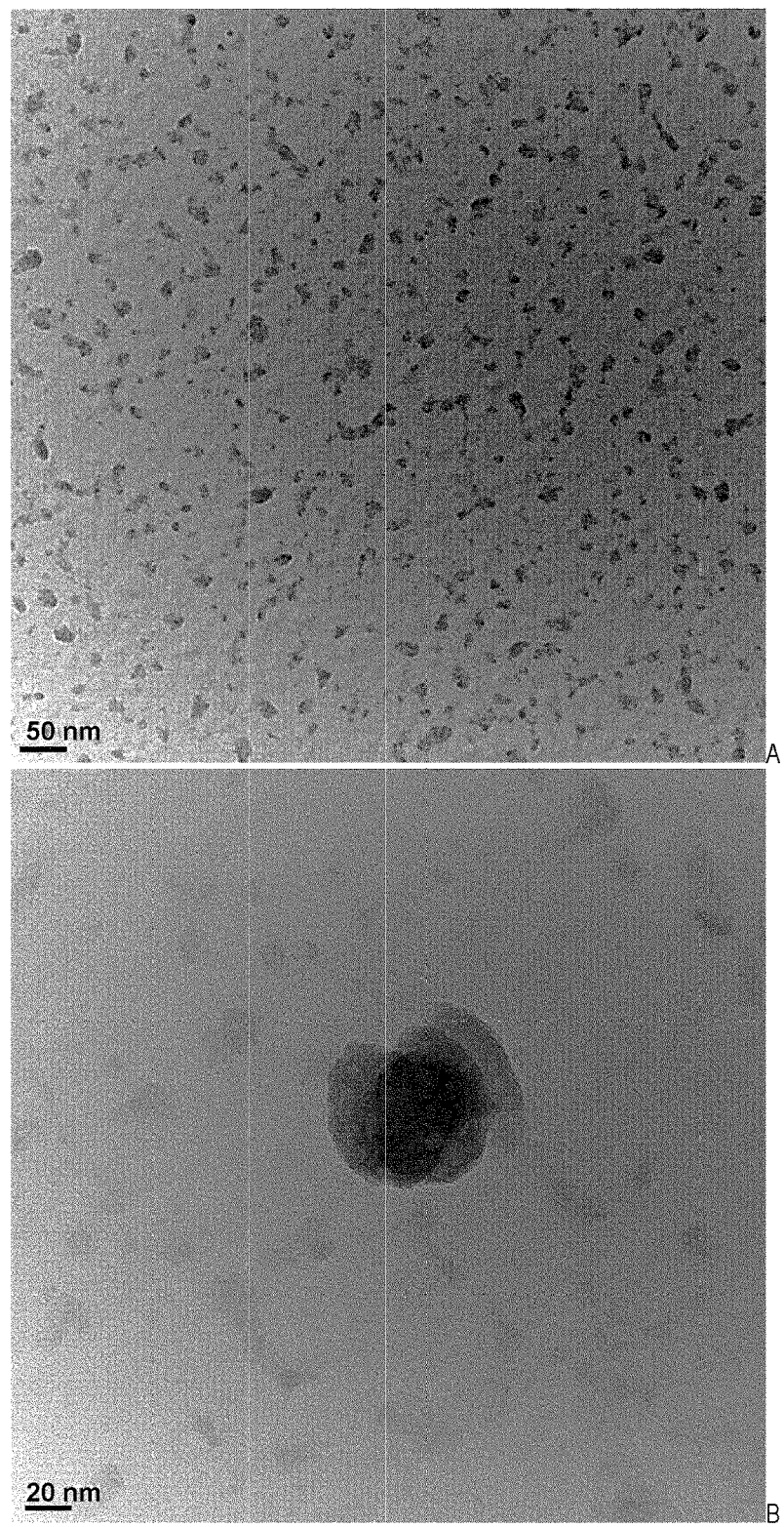
FIG. 11 (A and B) are TEM micrographs of ash treated according to Experiment #6 of Example 2.

For illustration, FIGS. 10 (A and B) and 11 (A and B) shows TEM images of the treated ash of Experiments #1 and 6, respectively. FIG. 10A shows several small nanoparticles, while FIG. 10B shows bigger clusters of nanoparticles. FIG. 11A shows several small nanoparticles, while FIG. 11B is a close up of a single nanoparticle where the coating is apparent.

Energy dispersive spectroscopy of the produced nanoparticles showed that they contained various elements (Si, Mg, Al, Ti, Cu, etc.).

Comparative Example 1—TEM of Uncoated Ash

Figure 12:
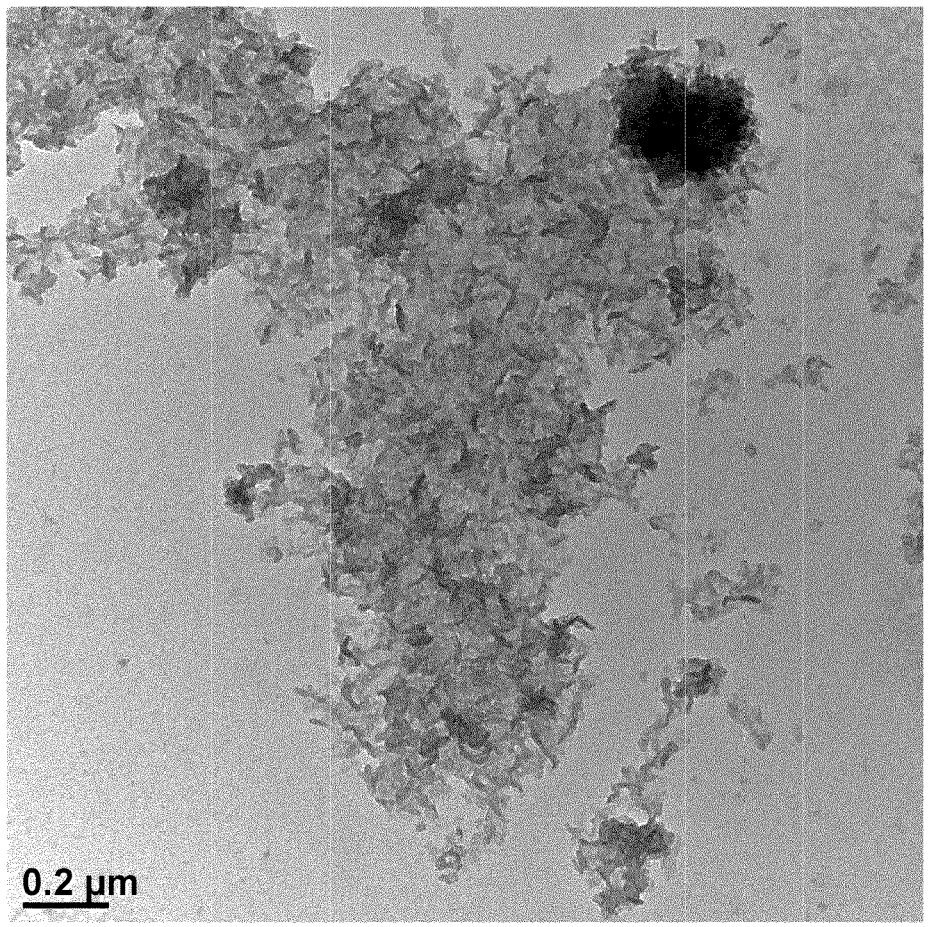
FIG. 12 is a TEM micrograph of uncoated ash according to Comparative Example 1.

Ash was subjected to steps 7 to 11 only of the process described in Example 2 and then examined by TEM. FIG. 12 is a TEM image of uncoated ash. The observed structure has a size of 1-2 microns.

Figure 13:
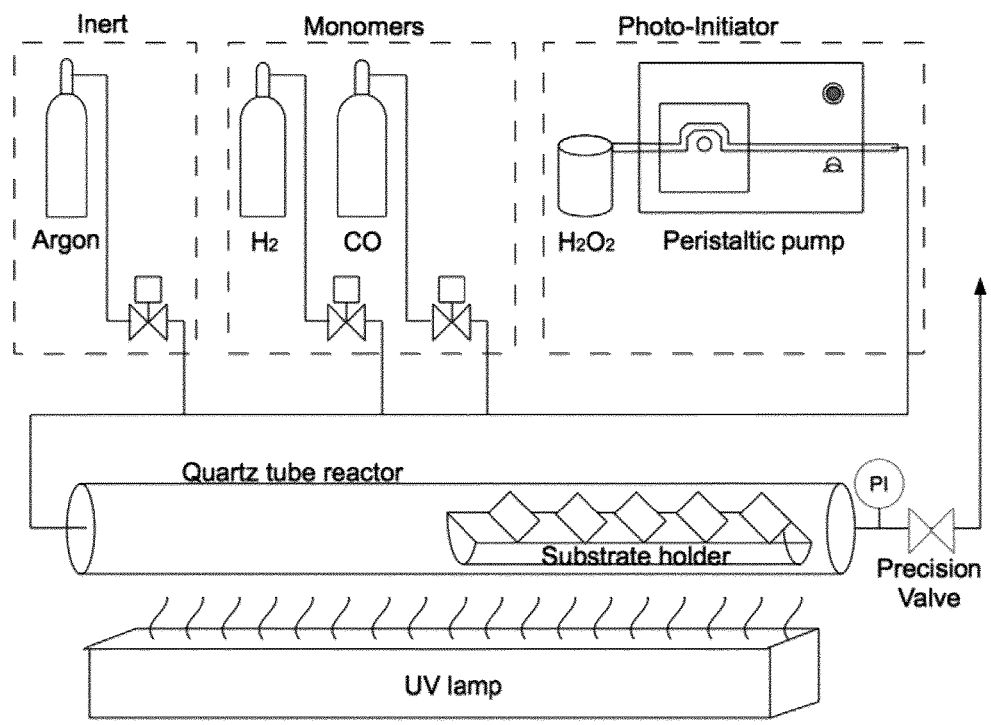
FIG. 13 shows the PICVD laboratory-scale setup used for the investigation used in Example 3.

Example 3—Further Hydrophilic and Hydrophobic Coatings Prepared by PICVD of Syngas Hydrophilic and hydrophobic thin films have been deposited onto flat metallic substrates through photoinitiated chemical vapor deposition (PICVD), using syngas as a precursor, and affordable UVC germicidal lamps as a source of light.
Methodology
Materials
Copper substrates were multipurpose copper (Alloy 110) sheets supplied by McMaster-Carr trimmed to 1.5 cm by 1 cm coupons. Argon (HP+), CO (Pur T-44) and H2 (UHP T-30) were supplied by Air Liquide. The reactor was made of two custom built 45 cm long quartz tubes with standard 24/40 taper joints and supplied by Technical Glass Products. All experiments were conducted with a dual-bulb 254 nm UVC germicidal lamp 96 cm in length, supplied by Cole-Parmer, which offers 5.5×10-4 W/cm$^2$ of light intensity. The light intensity was measured with an International Light Technologies ILT 1700 Research Radiometer. The joints were sealed using standard clips and high vacuum laboratory grease (Dow Corning). The mass flow controllers were part of the 5850E Brooks series and calibrated for each gas. The sandpaper used for substrate polishing was 2500 grit supplied by McMaster-Carr.
Experiment
The experimental setup is shown in FIG. 13. The gas mixture was fed to a custom made quartz tube, to be irradiated by the UV lamp. The H$^2$ and CO gas ratio was controlled by adjusting each gas' individual mass flow controller. The experiment duration was fixed to 1 h. Before any experiments, the copper coupons were thoroughly polished using deionized water and sandpaper. An 18 cm long and 1.5 cm wide holder was used to insert the freshly polished substrates into the reactor. A total of 5 copper substrates, spaced 3.5 cm apart, could be inserted at the same time. The coupons were inclined with an angle of 45° with respect to the gas flow.

Copper was used because it has been known to work with PECVD, so a comparative standard exists. The temperature inside the reactor was monitored with an IR temperature sensor with an emissivity factor of 0.75. The operating pressure in the reactor was controlled via a 3-way valve placed at the output. One of the two outputs of the valve was linked to a vacuum line, while the second led to a fume hood. This configuration allowed a pressure range from ±10 kPa gauge. The quartz tubes were previously cleaned by submerging them in a solution of NaOH 5.0 M for 24 h. They were then rinsed with distilled water and air dried. Before any experiments, argon was used to purge the reactor for 3 min. The reactor was then covered with standard commercial aluminum foil. When the experiments were completed, the copper substrates were carefully taken out of the reactor and placed in a plastic container filled with argon.
Experimental Conditions
The effects of the following parameters have been tested:
H$_2$/CO molar ratio (varying from 1/16 to 4),
total flow rates (varying from 260 to 1000 ml/min),
position in the reactor from 1 to 8 (8 arbitrary positions uniformly spaced apart from each other in the second tube, spacing being 1/8 of the tube length),
pressure in the reactor (varying from −10 to +10 kPa gauge),
delay before analysis (in number of days after deposition of the coating),
order of experiment (to identify and control for cumulative effects over time, for example lamp degradation), and
light intensity (increased by partially or totally enclosing the lamp together with the reactor using aluminum paper). Note: this also has the effect of increasing the reactor temperature as well by about 30° C.

A secondary objective was to test the capacity of H$_2$O$_2$ to act as a photoinitiator. For these experiments, 0 to 10 mL/h was injected in to the reactor by means of a peristaltic pump. H$_2$O$_2$ used was 50% concentrated and supplied by Fischer Scientific.
Modeling Methodology
As the present study represents an investigation of a wholly new process, experimental design was applied to determine the effect of a large variety of parameters and trends were extracted through multivariate analysis. The first step of this method consists in normalizing the data, as well as the response (here being the resulting contact angle).

Once normalized, it becomes fairly easy to derive empirical models, usually starting by trying multilinear regression, then increasing the complexity if needed. Having three levels (−, 0, +) per parameters helps to determine if the relationship between the parameter and the response is either linear or better approximated by a polynomial.

Also, sometimes some parameters by themselves do not have effect, but do have an effect when combined with another factor.

The modeling was achieved following a multilinear approach using the Microsoft Excel solver to find the parameter coefficients. The approach consisted of trying to model with parameters individually, and then trying combined effects.

Characterization

Figure 14:
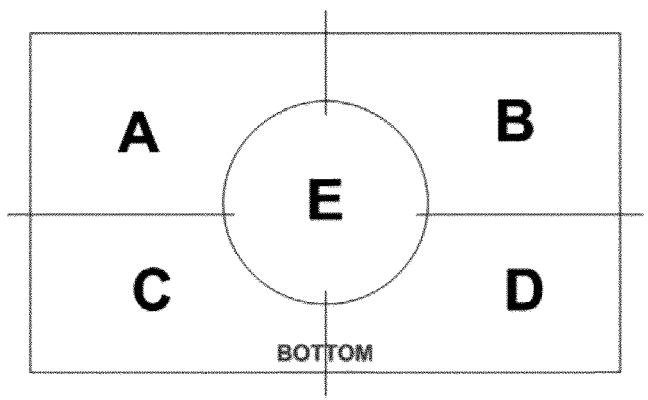
FIG. 14 shows the mapping used for goniometry measurements.

The treated copper substrates were analyzed by goniometry with distilled water, Fourier transform infrared spectroscopy (FTIR) (Spectrum 65 from PerkinElmer) and field emission scanning electron microscopy (FESEM) (JEOL JSM7600F). The exiting gases were captured through an acetone bubbling column (A18P-4, Fischer Scientific) for analysis by GCMS. The acetone was HPLC grade (≥99.9% purity) and supplied by Sigma-Aldrich. The GCMS system was an Agilent 7890A with a HP-88 column matched with the quadrupole Agilent 5975 detector operated at a helium flow rate of 1.5 mL/min. The light intensity was monitored by an Ocean Optics USB2000 spectrophotometer. The goniometry measurements were achieved by placing 4 μL of distilled water on every copper samples. The sessile drop water contact angle being stable on the minute time frame, one measurement per location was taken immediately for 5 locations per sample using a NRL C.A. Goniometer (Model No. 100-00 115). FIG. 14 represents a typical sample and shows the 5 locations where the measurement was taken.

Results

Figure 15:
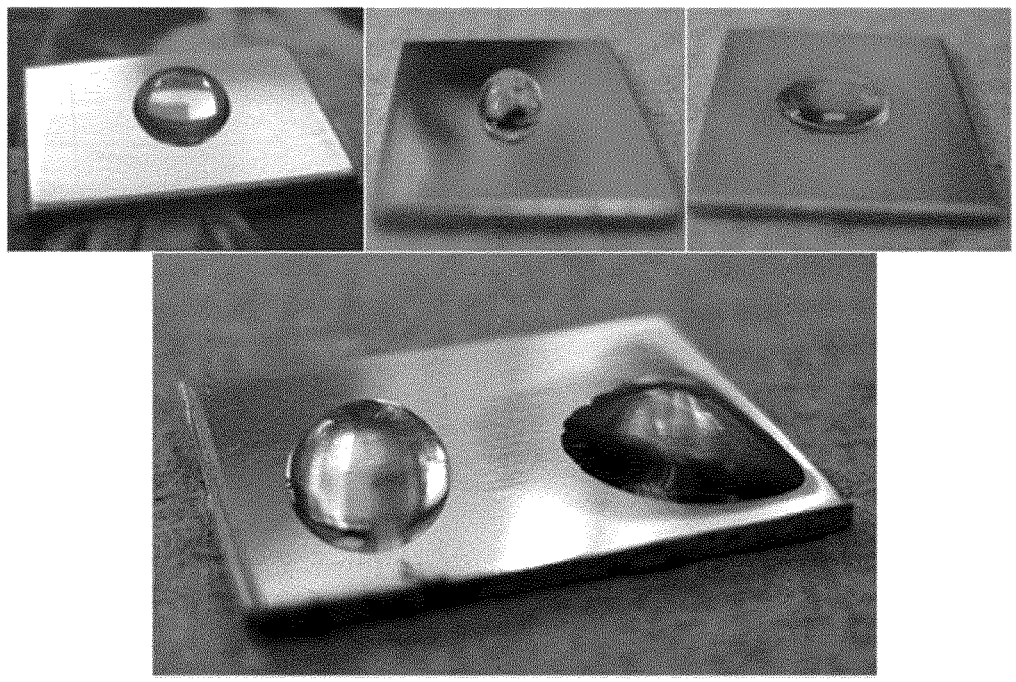
FIG. 15 shows in top row, the water contact angle of samples, respectively untreated, hydrophobic and hydrophilic; the picture shows a coating with sections having different contact angles.

The results showed that, indeed, PICVD was able to functionalize the surface of copper substrate using syngas as precursor. FIG. 15 demonstrates the before and after effect of such coating.

Modeling Results

The modeling of the PICVD process has been made in two steps. The first was an overall mapping of the conditions and process parameters, while the second was a refinement of the first. This approach helped to eliminate the non-significant parameters and, at the same time, gave indication about what direction to go in order to push the boundaries, and therefore expand the validity of the model. As a result, the model's coefficient readjusted a little, and some parameters, like the delay before analysis, could be excluded simply by adapting the procedure.

Figure 16:
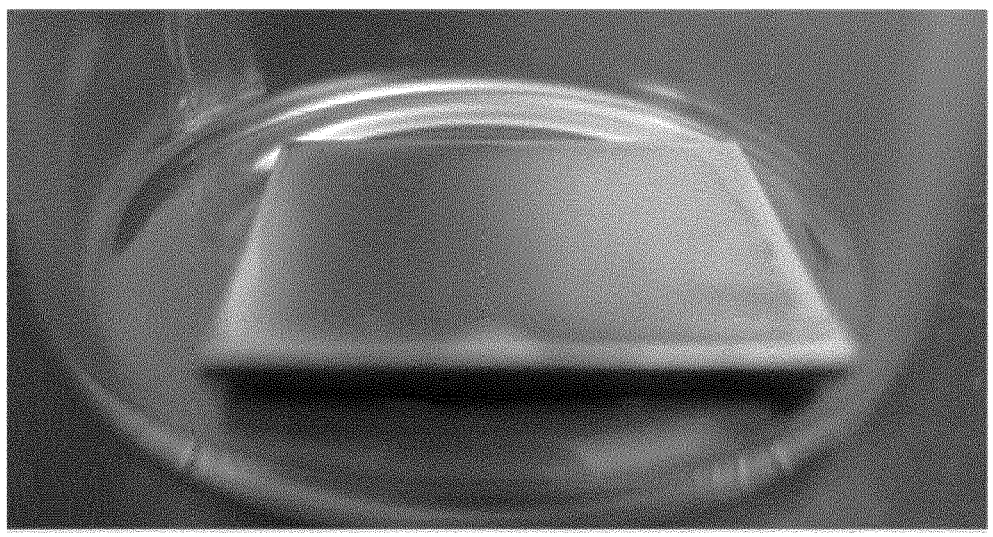
FIG. 16 shows that a red spot, obtained in a coating produced in Example 3, seems to cure into a blue color.

Looking at some visible coatings that were obtained (bottom picture, FIG. 15), it can be noticed that surface coverage is non-uniform, therefore measuring the contact angle of very thin or non-existent coating instead of the evident "sweet spot". Since the objective is to model the contact angle of the coating, and not the surface in average, the data must be filtered accordingly. The measurement procedure can be easily readjusted when the coating is visible, but data filtering can be more complicated when the coating is invisible, which was the case most of the time. First, the measurements corresponding to the copper's native water contact angle ($\bar{x}_{copper}$=70°) were dismissed right away. Furthermore, FIG. 16 shows that the coating usually has a fade with multiple colors, and indeed the contact angles varied accordingly.

Tables 5 and 6 present the parameters for the series of experiment conducted, including the water contact angle measured as well as some additional information. The "selected" column represents the angle considered for the model for a specific experiment. The selection was made according to Eq. (1). This selection prior to modeling was necessary due to the lack of uniformity noted on the surfaces. Since the contact angle of the copper is known, it was possible to determine where the coating was present by picking the measurement that was the furthest from the copper, no matter what direction (hydrophilic or hydrophobic). In other words, this study was more concerned about the difference than the absolute contact angle. These experiments have allowed for reaching contact angles from 30° to 100°, without the addition of photoinitiator or sensitizers, simply by mapping the experimental conditions. More extreme values have been obtained when using $H_2O_2$ and running for extended periods (up to 3 h).

$$x_{selected}=x(\text{argmax}|x_i-x_{copper}|) \text{ for } i=1 \ldots 5 \quad (1)$$

This lack of uniformity can be due to the flow dynamics of the system. As a first proof of concept, the emphasis was on the most extreme value, assuming that uniformity is an issue that can be addressed subsequently. In other words, this study focused on what was achievable rather than on an average uniformity-biased efficiency. The following empirical model has been derived from the data for the experiment without hydrogen peroxide (experiments presented in Table 5):

$$x_{selected}=A*P+B*\text{Pos}+C*P*r+D*P*\text{Pos}+E*r+F*r*\text{Pos}+G*P^2+H*\text{Pos}^2+I \quad (2)$$

where A=0.339830757; B=26.7091834; C=−0.589446283; D=0.342311309; E=−12.85820393; F=1.65152441; G=0.040712673; H=−2.105524434; I=−13.9490833126209; P is the relative pressure in the reactor in kPa; "Pos" is the position in the reactor (an integer dimensionless parameter between 1 and 8) and r is the $H_2/CO$ molar ratio (also dimensionless).

TABLE 5

Experimental data - experiments without $H_2O_2$

| Process Parameters | | | | Goniometry measurements | | | | | Basic statistics | | | |
|---|---|---|---|---|---|---|---|---|---|---|---|---|
| P | R | Pos | $H_2O_2$ | A | B | C | D | E | Max | Min | Avg | Selected |
| −10 | 0.125 | 4 | 0 | 62 | 37 | 42 | 67 | 67 | 67 | 37 | 55.0 | 37 |
| −10 | 0.125 | 5 | 0 | 64 | 57 | 50 | 59 | 72 | 72 | 50 | 60.4 | 50 |
| −10 | 0.125 | 6 | 0 | 63 | 57 | 55 | 71 | 71 | 71 | 55 | 63.4 | 55 |
| −10 | 0.125 | 7 | 0 | 46 | 58 | 55 | 47 | 47 | 58 | 46 | 50.6 | 46 |
| −10 | 0.125 | 8 | 0 | 71 | 46 | 72 | 72 | 72 | 72 | 46 | 66.6 | 46 |
| 10 | 4 | 4 | 0 | 47 | 46 | 45 | 64 | 30 | 64 | 30 | 46.4 | 30 |
| 10 | 4 | 5 | 0 | 49 | 49 | 52 | 52 | 54 | 54 | 49 | 51.2 | 49 |
| 10 | 4 | 6 | 0 | 72 | 66 | 66 | 58 | 76 | 76 | 58 | 67.6 | 58 |
| 10 | 4 | 7 | 0 | 68 | 74 | 76 | 68 | 68 | 76 | 68 | 70.8 | 76 |
| 10 | 4 | 8 | 0 | 67 | 63 | 70 | 84 | 84 | 84 | 63 | 73.6 | 84 |
| −20 | 4 | 4 | 0 | 62 | 65 | 66 | 66 | 67 | 67 | 62 | 65.2 | 62 |
| −20 | 4 | 5 | 0 | 76 | 79 | 79 | 79 | 79 | 79 | 76 | 78.4 | 79 |
| −20 | 4 | 6 | 0 | 79 | 73 | 69 | 70 | 70 | 79 | 69 | 72.2 | 79 |
| −20 | 4 | 7 | 0 | 68 | 67 | 64 | 63 | 73 | 73 | 63 | 67.0 | 63 |
| −20 | 4 | 8 | 0 | 65 | 65 | 65 | 75 | 67 | 75 | 65 | 67.4 | 65 |

TABLE 5-continued

Experimental data - experiments without $H_2O_2$

| Process Parameters | | | | Goniometry measurements | | | | | Basic statistics | | | |
|---|---|---|---|---|---|---|---|---|---|---|---|---|
| P | R | Pos | $H_2O_2$ | A | B | C | D | E | Max | Min | Avg | Selected |
| 10 | 0.125 | 4 | 0 | 84 | 86 | 86 | 86 | 86 | 86 | 84 | 85.6 | 86 |
| 10 | 0.125 | 5 | 0 | 87 | 88 | 90 | 94 | 94 | 94 | 87 | 90.6 | 94 |
| 10 | 0.125 | 6 | 0 | 95 | 94 | 96 | 87 | 71 | 96 | 71 | 88.6 | 96 |
| 10 | 0.125 | 7 | 0 | 86 | 95 | 90 | 91 | 89 | 95 | 86 | 90.2 | 95 |
| 10 | 0.125 | 8 | 0 | 95 | 90 | 91 | 90 | 71 | 95 | 71 | 87.4 | 95 |

TABLE 6

Experimental data - experiments with $H_2O_2$

| Process Parameters | | | | Goniometry measurements | | | | | Basic statistics | | | |
|---|---|---|---|---|---|---|---|---|---|---|---|---|
| P | R | Pos | $H_2O_2$ | A | B | C | D | E | Max | Min | Avg | Selected |
| 10 | 0.125 | 1 | 1 | 90 | 91 | 92 | 94 | 97 | 97 | 90 | 92.8 | 97 |
| 10 | 0.125 | 2 | 1 | 97 | 101 | 95 | 94 | 99 | 101 | 94 | 97.2 | 101 |
| 10 | 0.125 | 3 | 1 | 94 | 93 | 95 | 91 | 97 | 97 | 91 | 94.0 | 97 |
| 10 | 0.125 | 4 | 1 | 94 | 96 | 92 | 96 | 96 | 96 | 92 | 94.8 | 96 |
| 10 | 0.125 | 5 | 1 | 95 | 94 | 101 | 96 | 90 | 101 | 90 | 95.2 | 101 |
| 10 | 0.125 | 1 | 0.5 | 47 | 40 | 57 | 38 | 37 | 57 | 37 | 43.8 | 37 |
| 10 | 0.125 | 2 | 0.5 | 40 | 34 | 43 | 47 | 33 | 47 | 33 | 39.4 | 33 |
| 10 | 0.125 | 3 | 0.5 | 60 | 62 | 43 | 45 | 38 | 62 | 38 | 49.6 | 38 |
| 10 | 0.125 | 4 | 0.5 | 41 | 35 | 58 | 38 | 39 | 58 | 35 | 42.2 | 35 |
| 10 | 0.125 | 5 | 0.5 | 39 | 40 | 63 | 47 | 41 | 63 | 39 | 46 | 39 |
| 10 | 0.125 | 4 | 1 | 49 | 43 | 44 | 65 | 50 | 65 | 43 | 50.2 | 43 |
| 10 | 0.125 | 5 | 1 | 61 | 59 | 47 | 58 | 48 | 61 | 47 | 54.6 | 47 |
| 10 | 0.125 | 6 | 1 | 56 | 55 | 55 | 58 | 51 | 58 | 51 | 55.0 | 51 |
| 10 | 0.125 | 7 | 1 | 57 | 60 | 63 | 50 | 61 | 63 | 50 | 58.2 | 50 |
| 10 | 0.125 | 8 | 1 | 58 | 61 | 65 | 56 | 59 | 65 | 56 | 59.8 | 56 |
| -15 | 0.125 | 1 | 1 | 62 | 62 | 60 | 33 | 62 | 62 | 33 | 55.8 | 33 |
| -15 | 0.125 | 2 | 1 | 64 | 72 | 91 | 91 | 72 | 91 | 64 | 78.0 | 91 |
| -15 | 0.125 | 3 | 1 | 58 | 50 | 47 | 44 | 45 | 58 | 44 | 48.8 | 44 |
| -15 | 0.125 | 4 | 1 | 57 | 56 | 75 | 70 | 51 | 75 | 51 | 61.8 | 51 |
| -15 | 0.125 | 5 | 1 | 68 | 72 | 67 | 69 | 65 | 72 | 65 | 68.2 | 65 |
| -15 | 0.125 | 4 | 1 | 50 | 46 | 42 | 47 | 42 | 50 | 42 | 45.4 | 42 |
| -15 | 0.125 | 5 | 1 | 41 | 50 | 55 | 55 | 49 | 55 | 41 | 50.0 | 41 |
| -15 | 0.125 | 6 | 1 | 58 | 55 | 61 | 60 | 55 | 61 | 55 | 57.8 | 55 |
| -15 | 0.125 | 7 | 1 | 62 | 62 | 62 | 64 | 63 | 64 | 62 | 62.6 | 62 |
| -15 | 0.125 | 8 | 1 | 57 | 59 | 57 | 60 | 51 | 60 | 51 | 56.8 | 51 |
| -15 | 0.125 | 1 | 0.5 | 62 | 54 | 47 | 45 | 52 | 62 | 45 | 52.0 | 45 |
| -15 | 0.125 | 2 | 0.5 | 40 | 32 | 38 | 35 | 37 | 40 | 32 | 36.4 | 32 |
| -15 | 0.125 | 3 | 0.5 | 37 | 42 | 40 | 51 | 50 | 51 | 37 | 44.0 | 37 |
| -15 | 0.125 | 4 | 0.5 | 53 | 60 | 51 | 65 | 55 | 65 | 51 | 56.8 | 51 |
| -15 | 0.125 | 5 | 0.5 | 90 | 82 | 85 | 81 | 81 | 90 | 81 | 83.8 | 90 |
| -15 | 0.125 | 4 | 0.5 | 99 | 100 | 87 | 86 | 82 | 100 | 82 | 90.8 | 100 |
| -15 | 0.125 | 5 | 0.5 | 58 | 46 | 50 | 52 | 60 | 60 | 46 | 53.2 | 46 |
| -15 | 0.125 | 6 | 0.5 | 49 | 56 | 52 | 52 | 50 | 56 | 49 | 51.8 | 49 |
| -15 | 0.125 | 7 | 0.5 | 55 | 56 | 59 | 52 | 55 | 59 | 52 | 55.4 | 52 |
| -15 | 0.125 | 8 | 0.5 | 50 | 53 | 53 | 54 | 50 | 54 | 50 | 52.0 | 50 |
| 10 | 0.125 | 4 | 0.5 | 101 | 74 | 91 | 99 | 80 | 101 | 74 | 89.0 | 101 |
| 10 | 0.125 | 5 | 0.5 | 94 | 91 | 95 | 94 | 92 | 95 | 91 | 93.2 | 95 |
| 10 | 0.125 | 6 | 0.5 | 93 | 89 | 100 | 94 | 93 | 100 | 89 | 93.8 | 100 |
| 10 | 0.125 | 7 | 0.5 | 79 | 89 | 90 | 90 | 88 | 90 | 79 | 87.2 | 90 |
| 10 | 0.125 | 8 | 0.5 | 90 | 95 | 92 | 93 | 90 | 95 | 90 | 92 | 95 |

Figure 18:
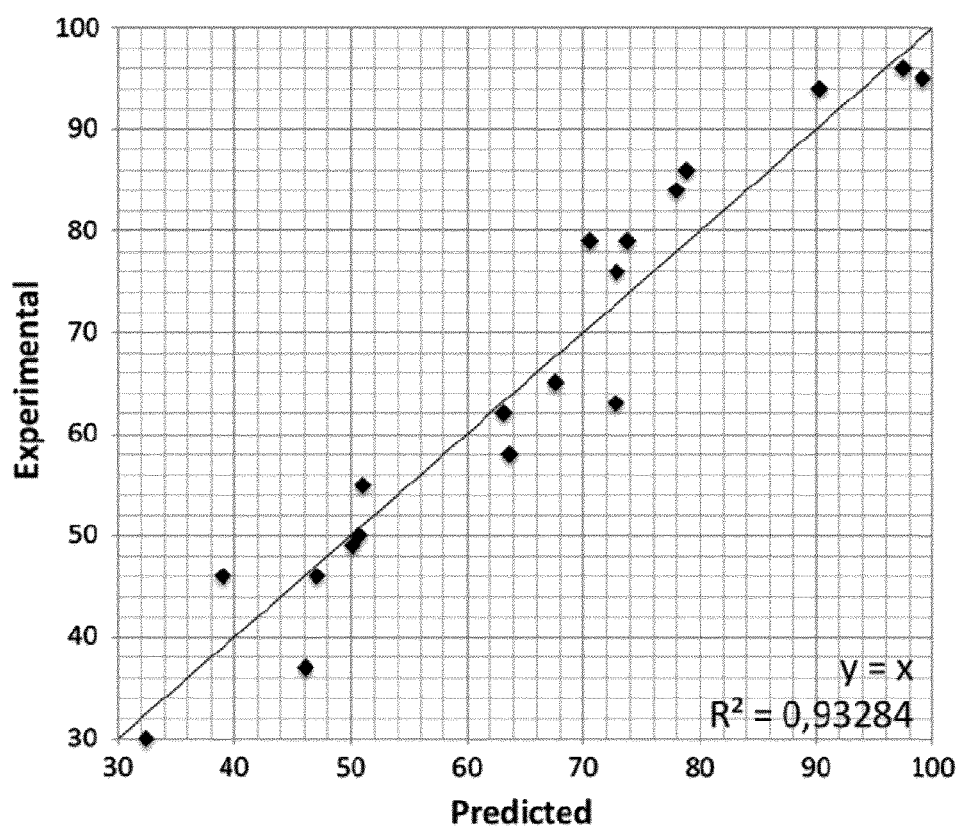
FIG. 18 shows the experimental versus predicted values for model shown in Eq. (2)

Since the model shown in Eq. (2) is rather complicated, a 3D visual representation of the model is presented in FIG. 17 for a fixed position (Pos) value of 4. It can be interpreted from this figure that there is a very strong interaction between parameters. This model fits the data with a determination coefficient ($R^2$) superior to 0.93, which is quite high considering the methodology employed. While the $R^2$ coefficient gives a good indication of the relation between two series of data, it lacks in terms of information regarding the exactitude of a model. Therefore, other attributes such as the slope and the intercept of the predicted versus obtained measurement must be considered. Such information is available in FIG. 18, which illustrates the relationship between the model and the experimental data. In the present case, the slope equals to 1, and the intercept to 0, which indicates that the model fits the data fairly well.

The present experiment has however that syngas was able to self-initiate in the presence of UV light, probably because of the formation of radicals. Experiments with $H_2O_2$ promoted the reaction by pushing the boundaries of contact angle measurements. The addition of hydrogen peroxide as a photoinitiator increased the range of water contact angles to 5° to 118°, and the angles seemed to be highly correlated with its flowrate.

It is worth noticing that the total pressure is the dominant factor with this configuration. Generally, pressures slightly below 1 atm translate into hydrophilic surfaces, while pressures slightly higher than 1 atm resulted into hydrophobic surfaces.

Characterization

GCMS

Figure 19:
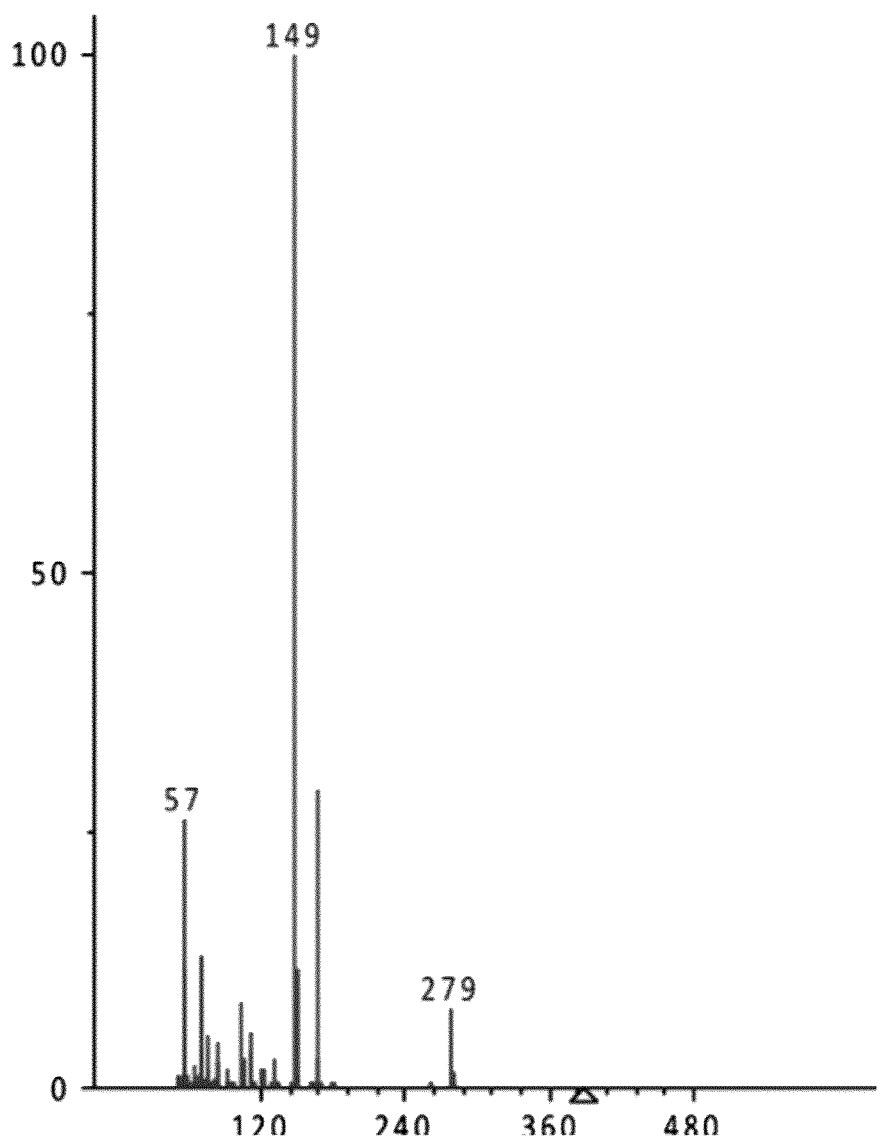
FIG. 19 shows the mass spectrometry with peak retention time of 17.4 min (x-axis is m/z ratio)

Samples of the outlet gas were analyzed by GCMS. The deposited compound has been identified as a close match to bis(2-ethylhexyl)-phthalate. A sample GCMS spectrum is shown in FIG. 19. This characterization of species in the gas phase provides information on 2 fronts. First, it gives insight into the reactions taking place in the reactor—them molecule formed is rich in double-bonds and aromatics, and can have a relatively long chain length. Second, it provides information with respect to secondary products formed, which is key for eventual scale-up.

FTIR

The FTIR was operated in attenuated total reflectance mode (ATR) in order to characterize the species present on the surface. With the available database, the closest match was phenol formaldehyde resin. Interestingly, the coating shared some properties with this family of resins, like its resistance to dissolution in solvents and its susceptibility to strong bases. That is the reason why NaOH was used for tube cleaning steps. While the match was not perfect, this indicates at least that the coated molecule is highly cross-linked and has a high concentration of C—C bonds. A sample FTIR spectrum resulting from spectrum subtraction with untreated copper is shown in FIG. 20, and its interpretation is given in Table 7.

TABLE 7

Figure 20:
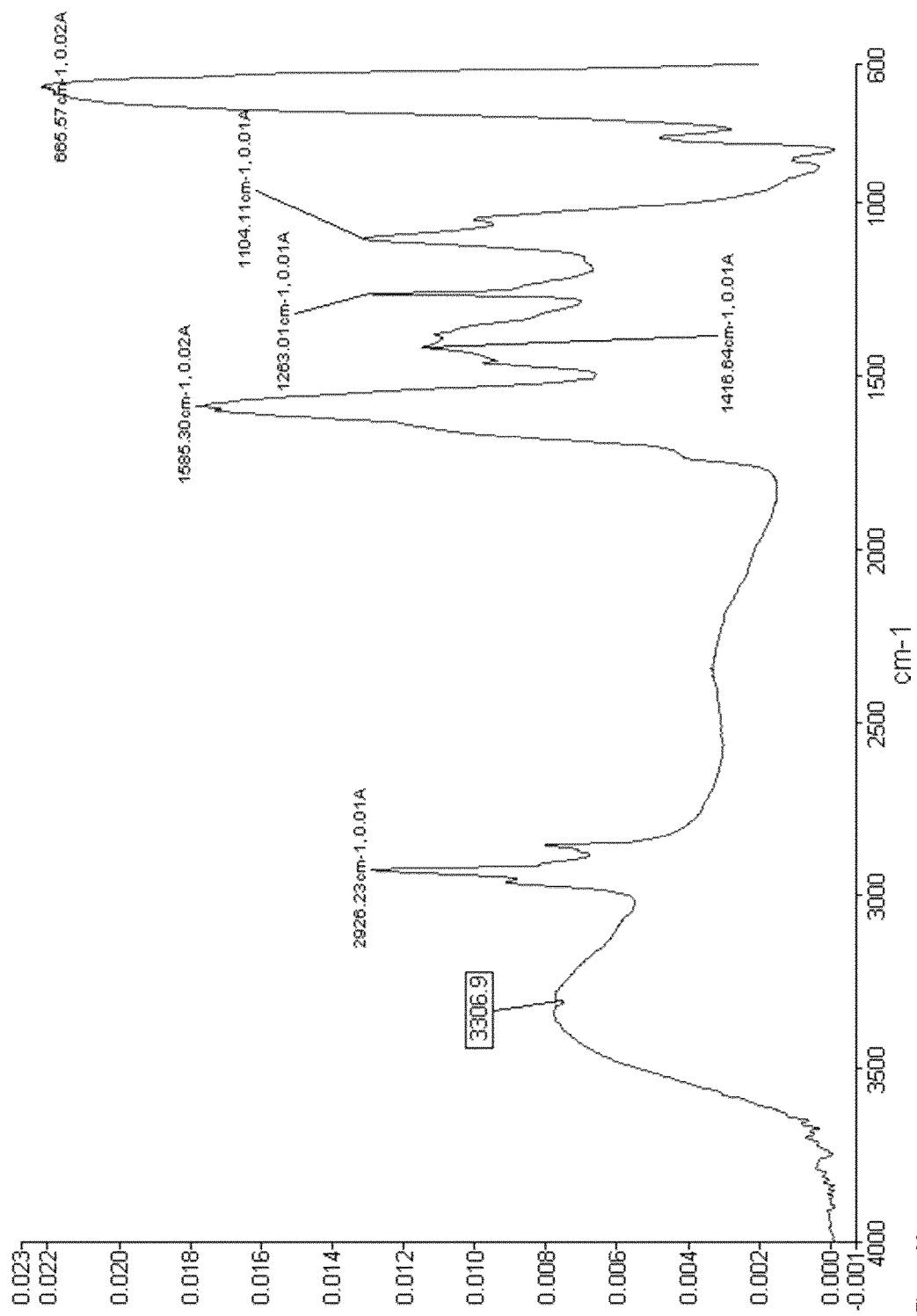
FIG. 20 shows the FTIR absorption spectrum ($H_2/CO=2$, P=0 kPa)

FTIR table—analysis of the spectrum shown in FIG. 20.

| Wavelength (cm$^{-1}$) | Bond | Additional information | References |
| --- | --- | --- | --- |
| 3300 | O—H stretch | Strong, broad (alcohol) | R. Silverstein, G. Bassler, T. Morrill, Spectrometric Identification of Organic Compounds, 4th edition John Wiley & Sons, 1981. |
| 2925 | C—H stretch | Alkane | |
| 1585 | C=C aromatic stretch | Medium-weak, multiple bands | |
| 1415 | C=C aromatic stretch | Medium-weak, multiple bands | |
| 1263 | C—O—C stretch | Ether | |
| 1100 | C—O stretch | Alcohol | |
| 666 | O=C=O scissoring | Confirmed by the bump at 2350 cm$^{-1}$ | K. Nakanishi, P.H. Solomon, Infrared Absorption Spectroscopy, 2nd edition Holden-Day, 1977. |

FESEM

Figure 21:
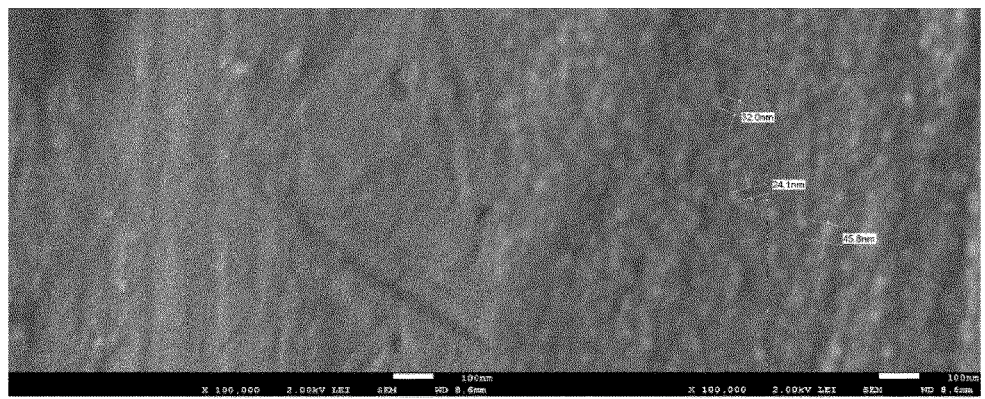
FIG. 21 shows the FESEM pictures of the surface before (left) and after (right) treatment.

FESEM images helped to determine the general morphology of the sample's surface. FIG. 21 shows the copper surface before (left) and after (right) treatment. As one can see, the morphology of the surface clearly differs. The coated sample (on the right) consisted of tiny circular islands of approximately 40 nm of diameter. The fact that those islands appear as being white means that they are made of an electrically non-conductive material, which is consistent with the hypothesis of a polymer or a resin. It is expected that increased treatment time would lead to merging of these polymer islands on the surface.

Characterization Based on Properties

In order to confirm the possibility that the coating is made of a phenol formaldehyde-like resin, some further characterization has been performed based on basic properties.

Electrical Resistivity

Electrical resistivity was evaluated by the four point resistivity method at a voltage of 0.1 mV at a distance of 1 mm. The coated surface had an electrical resistivity of 127 times higher than that of the copper alone with a thickness of about 1 μm, roughly estimated by profilometry (Dektak 150). Although the four point resistivity method is not a valid method to measure the exact resistivity coefficient of the material, it still gives information about the insulating property of the coated material. Although this fact alone is inconclusive, it agrees with the hypothesis of a phenol formaldehyde-like resin.

Solvability

The coating was insoluble in common solvents (example: acetone, methanol, ethanol, and butanol) but could be removed using strong caustic (NaOH 5 M). This also agrees with the hypothesis of a phenol formaldehyde resin, which is known to react with strong bases.

Visual Inspection

Figure 22:
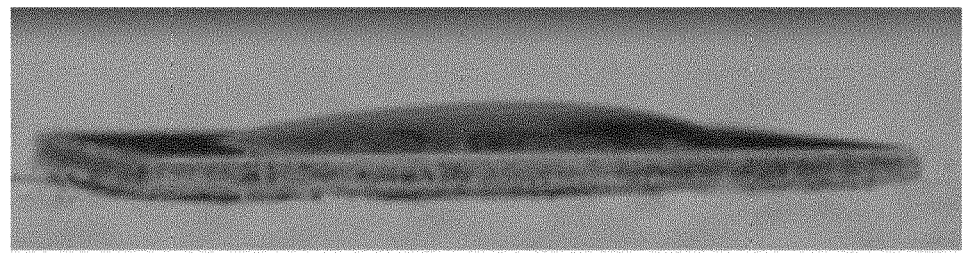
FIG. 22 shows that spots exhibit very low water contact angles.
Figure 23:
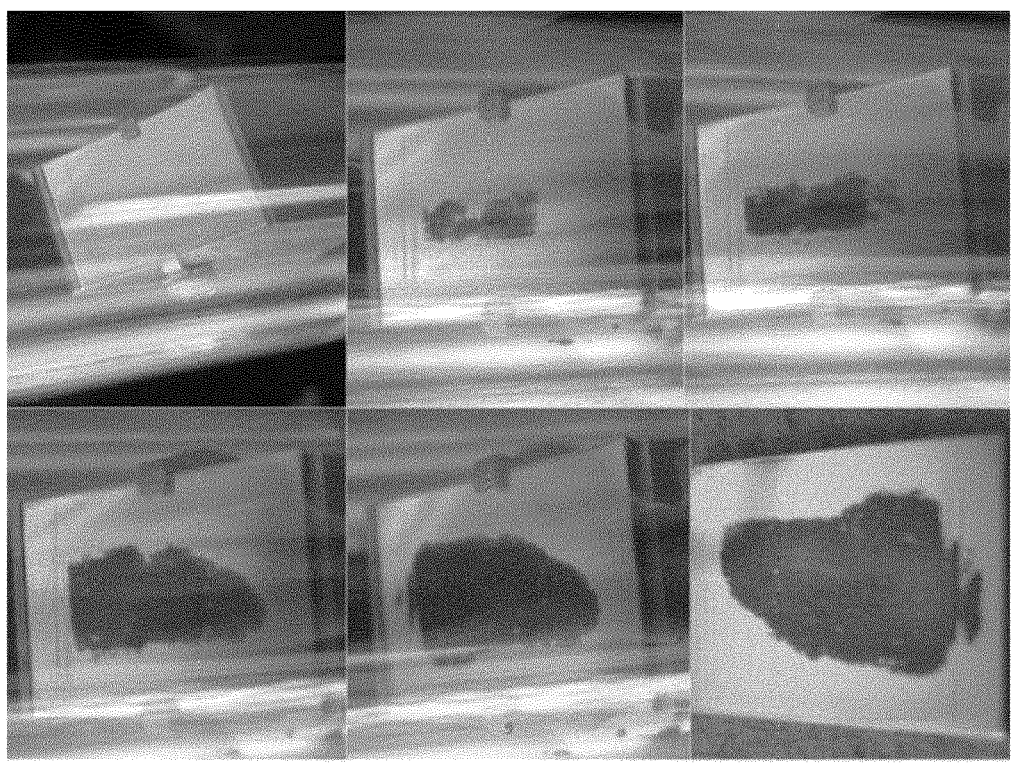
FIG. 23 shows the growth progression of red spots over an hour.

It is worth mentioning that the presence of red spots appeared in some cases and not in others. However, this phenomenon was not significantly correlated to any experimental parameters. The red spots tended to be superhydrophilic (≤10°) (see FIG. 22), more so than their transparent counterparts for the same experimental conditions. Over a hundred experiments have been conducted in order to find a pattern leading to such occurrences. Despite these efforts, the red spots seemed to appear randomly and therefore, could not be statistically associated with any combination of known parameters. FIG. 23 illustrates the appearance of these spots. Some variants appeared as shown in FIG. 16, where the red eventually evolved into a bluish color.

Hydrophobic Recovery

Another concern that remains is the hydrophobic recovery, which consists of a hydrophilic surface that loses its property over time. During the experiment, it has been noticed that hydrophilic surfaces lose a great deal of their hydrophilicity over a short period of time (within 24 h). For that reason, the water contact angles were measured in the hour following the deposition.

It has been observed that hydrophobic surfaces remained stable over time, since no significant changes in measurement were noticed one week later.

Conclusion

The current process was able to produce both hydrophilic and hydrophobic coatings on copper.

In the tested conditions, it has been determined that syngas can be photopolymerized by UVC germicidal lamps to deposit functional groups onto copper.

The deposited compound has been identified as being very similar to phenol formaldehyde resin. The gas sample analysis identified the bis(2-ethylhexyl)-phthalate as being produced in the reactor.

With a highly scalable method, it has been possible to produce high quality and dense coatings at deposition temperatures as low as room temperature and at atmospheric or near-atmospheric pressures.

Example 4—PICVD Coating of Other Substrates

Using the set-up of Example 3, coatings were successfully produced on steel, $TiO_2$, wood, and ZnO.

Example 5—Further PICVD Coating of Ash

The extraction of low-cost, low-grade nanoparticles from a ubiquitous and abundant feed stock: fly ash from municipal solid waste (MSW) incineration is described below.

The novel technique we apply is capable of both extraction and functionalization of the nanoparticles present in this undervalued waste stream using photo-initiated chemical vapor deposition (PICVD). By setting functionalization conditions to favor hydrophilic surface properties, the treated ash can readily be dispersed in a polar solvent such as water: larger particulates then settle out of suspension, while the lighter nanoparticles remain in the supernatant and are ready for use.

This method yields low-grade nanoparticles (polydisperse and multi-composite) that can be used in a variety of applications, such as increasing the thermal conductivity of composites and nanofluids.

Materials and Methods

MSW fly ash was provided by the Quebec city MSW incinerator. This waste residue is selected in order to verify the effectiveness of our process for what we consider to be the most difficult class of fly ash to treat, as it has the widest range of particle sizes and materials composition; thus demonstrating the range and versatility of our process. Ash powder was sieved using meshes with 300 μm, 150 μm, and 75 μm size. Then, 1 g of ash powder from the less than 75 m fraction was used for the experiments. The PICVD technique was then applied for functionalization of particles in ash samples.

PICVD Experimental Apparatus

Figure 24:
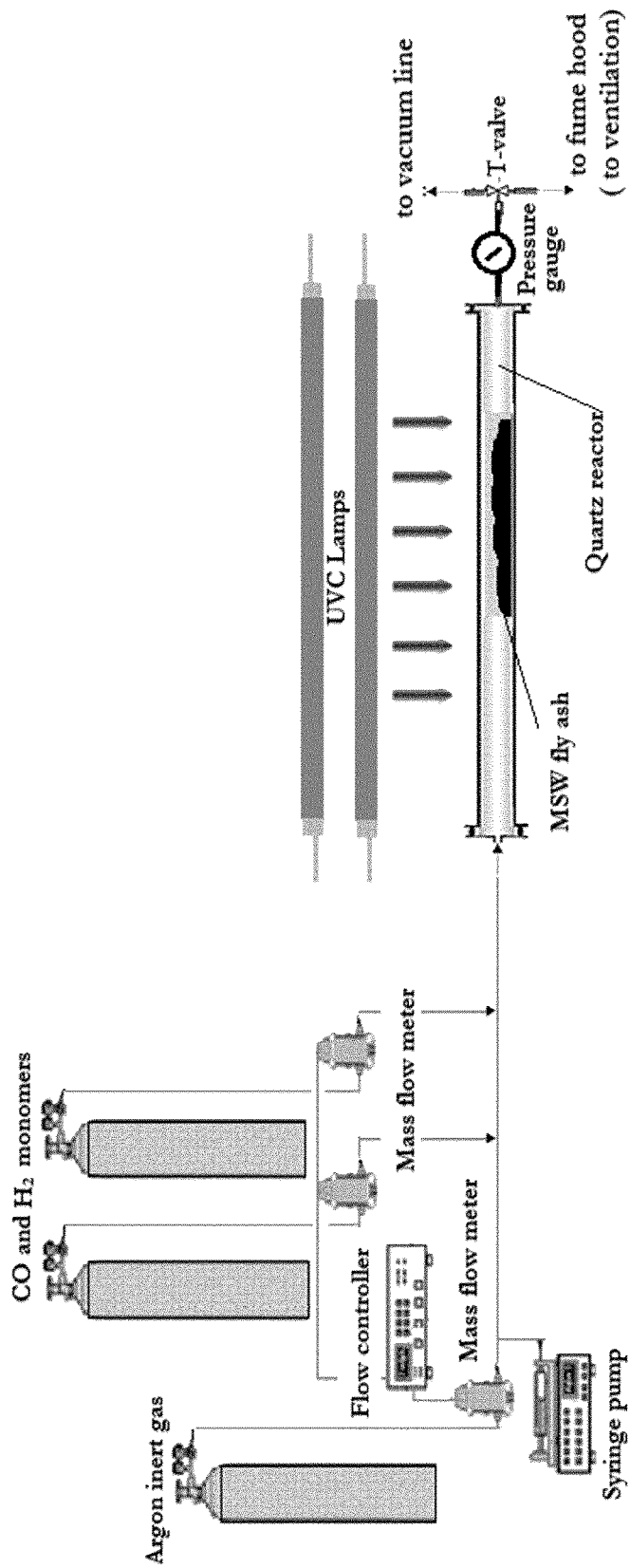
FIG. 24 shows the experimental apparatus and injection set-up used in Example 4.

FIG. 24 shows the schematic of the experimental apparatus. The PICVD unit consisted of two 254 nm UVC mercury or germicidal lamps as an initiation source (Cole-Parmer) and a 45 cm long quartz reactor using standard 24/40 taper joints (Technical Glass Products). The UVC lamps had a main peak at a wavelength of 254 nm. Syngas (CO and $H_2$) was used as the functionalization precursor (CO: Pur T-44 and $H_2$: UHP T-30—Air Liquide). Although, these reactants are not in the peak absorption of UVC lamps (254 nm), they can be activated at 254 nm and produce active compounds for the formation of functionalized polymeric films. Argon gas (HPT—Air Liquide) was used to purge the reactor before experiments to remove oxygen. For some experiments, $H_2O_2$ (50% aqueous solution—Fischer Scientic) was added as a photoinitiator to accelerate reaction kinetics and enhance the polymerization rate, this was done using a syringe pump at a rate of 0.02 mL/min. Experiments were performed either under slight vacuum (−10 kPa) or at near atmospheric pressure regulated by a T-valve at the end of reactor. The irradiance of the UVC lamps was measured at 3.5 cm away from the lamp (in the same distance of reactor from the lamps) using an ILT1700 radiometer/photometer coupled with a SED240/QNDS2/W254 nm sensor (International Light Technologies). The average irradiance at this distance was $5.5 \times 10^{-4}$ W/cm$^2$.

Extraction and Functional Encapsulation of Nanoparticles from Ash Powder

At first, 1 g of ash powder was loaded in a metal holder and inserted to the reactor. Oxygen molecules are strong electron scavengers; thus, their presence will result in termination of reactions. To avoid this, reactor was purged using argon gas for 5 minutes. Then, the mixture of CO: 390.1 mL/min and $H_2$: 48.7 mL/min was injected into the reactor ($H_2$/CO ratio of 12.5%). Experiments were performed either while (1) UVC lamps were turned on, or (2) they were turned off (control experiments—syngas was flowing in the reactor). The duration of experiments was fixed to 1 h. The temperature inside the reactor was monitored during experiments using an infrared temperature sensor. The measured temperature was 30±6.5° C. Table 8 summarizes the details of all experiments. Treated ash powders were then dispersed in deionized water and the resulting aqueous samples were loaded in an ultrasonic bath for 2 h in order to disperse the particles. The large particulates were then allowed to settle for 24 hours before the liquid supernatant was collected for analysis.

TABLE 8

Experimental details

| Experiment Number | $H_2O_2$ Injection | UVC Lamps | Dispersion Medium | Pressure |
|---|---|---|---|---|
| 1 | No | Off | Water | Near atmospheric |
| 2 | No | On | Water | Near atmospheric |
| 3 | Yes | On | Water | Near atmospheric |
| 4 | No | On | Water | Vacuum (−10 kPa) |
| 5 | Yes | On | Water | Vacuum (−10 kPa) |
| 6 | No | On | Acetone | Near atmospheric |

Characterization and Analytical Procedures

Dispersed solids remaining in the supernatant were analyzed using transmission electron microscopy (TEM-model JEM 2100F-JEOL Company) in combination with energy-dispersive X-ray spectroscopy (EDS). TEM was operated at 200 kV to acquire bright field images of samples. Morphology and elemental analyses were conducted using copper (Cu) and nickel (Ni) TEM grids coated with a lacey carbon film (D20040 Grids with formvar substrates mesh 400, metal Cu; D20045 Grids with formwar substrates mesh400, metal Ni-SOQUELEC International). The grids were first soaked in the liquid samples and then in the deionized water for few seconds in order to avoid salt contamination on the grids. Then, samples were dried at the room temperature (22±2.5° C.) and analyzed. All experimental conditions were repeated at least twice and analyzed using both types of TEM grids in all cases. After sampling, the remaining supernatant was dried overnight at 55° C. and analyzed by Fourier transform infrared spectroscopy (FTIR). A Thermo Scientific Nicolet 6700 FTIR spectrometer with an insert cell for diffuse reflectance spectroscopy was used to obtain chemical information about the coating and functional organic groups the treated particulates. OMNIC software was used to identify the corresponding peaks. Each sample was scanned 32 times with a resolution of 4.0 cm$^{-1}$.

Result and Discussion

Figure 25:
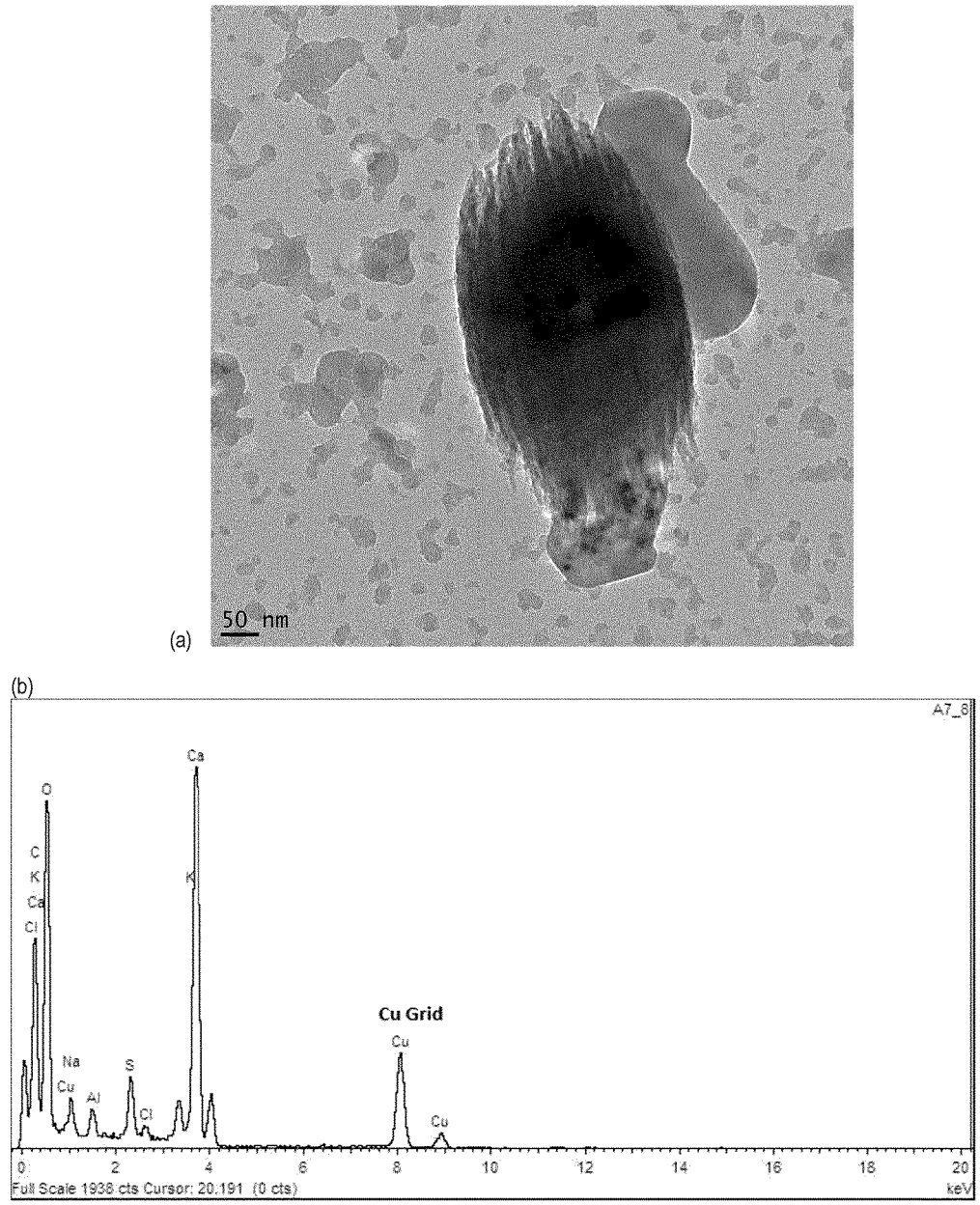
FIG. 25 shows (a) a single particle identified on a TEM grid from control experiments; and (b) the corresponding EDS spectrum showing its composition is mainly Ca.
Figure 26:
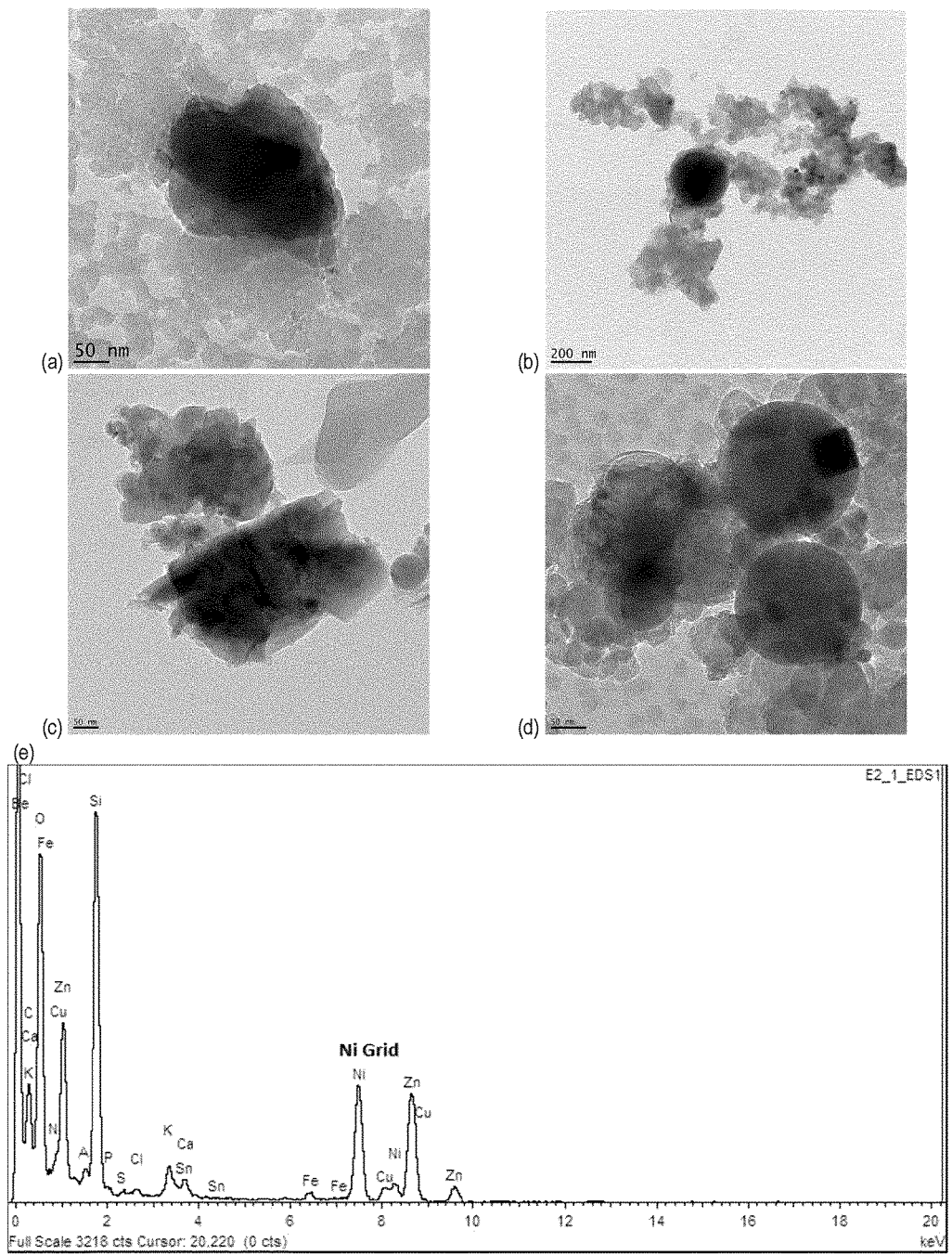
FIG. 26 shows TEM micrographs of treated samples (a) Experiment #2, (b) Experiment #3, (c) Experiment #4, (d) Experiment #5, (e) Representative of EDS spectrum taken from experiment #3 of Example 4.

FIGS. 25 and 26 show, respectively, the TEM/EDS results of PICVD-treated and untreated ash samples. Results for control experiment (#1, Table 8) in FIG. 25 indicate that there are little or no metal nanoparticles present, except Ca in oxidized form, demonstrating that there is limited potential to extract useful nanoparticles without a functionalization treatment. The TEM micrograph also illustrates the presence of salt (lower-contrast particulates). This by-product is contained in the ash samples, both natively or as a result of the gas cleaning steps applied during the waste incineration process.

The TEM/EDS results of experiments #2 to #5 (Table 8) in FIG. 26 demonstrate the presence of nano size particles in the supernatant of treated ash samples. The nanoparticles found in these samples vary based on the composition of the primary ash sample. Two types of grids had been used in order to identify possible Cu and Ni nanoparticles in the samples. EDS analysis was performed on different sections of the grids, confirming the presence of Si, Al, Zn, and Fe as dominant nanoparticles in all of the samples, as well as Cu, Sn, Pb, and Mg.

Lower-contrast salt particulates were also visible for these experiments. These can be removed through successive rinsing steps with water. These results show that extraction of nanoparticles either in the presence or in the absence of $H_2O_2$ is possible. From treatment to treatment, the same type of nanoparticles can be extracted.

Several nanofillers like copper oxide (CuO and $Cu_2O$)], iron oxide (FeO, $Fe_2O_3$ or $Fe_3O_4$), zinc oxide (ZnO)], $CaCO_3$, silica or silicon carbide, and aluminum oxide ($Al_2O_3$) have been applied for in situ polymerization, as previously discussed. These nanoparticles can increase electrical conductivity, photovoltaic properties, thermal conductivity and thermal stability of the composite. Almost all of these compounds can be found in the MSW ash samples treated by our method. Although nanoparticles were found either in the single form (FIG. 26 (a, c)) or in the agglomerated form (FIG. 26 (b, d)), our approach is valid due to (1) its advantages compared to the other functionalization techniques, (2) extraction of useful nanoparticles allowing clean and closed industrial scale production cycles and (3) increasing dispersion stability of nanoparticles because of their functional coating.

The low-grade particles we can extract may find applications in various fields. In order to extend the range of applications, dispersion in other solvents has been studied. Treated ash samples were dispersed in acetone, a solvent with a lower polarity index than water. TEM/EDS results showed identical nanoparticles, which demonstrates that either polar (water) or semi-polar (acetone) solvents can be applied for extraction of nanoparticles.

Figure 27:
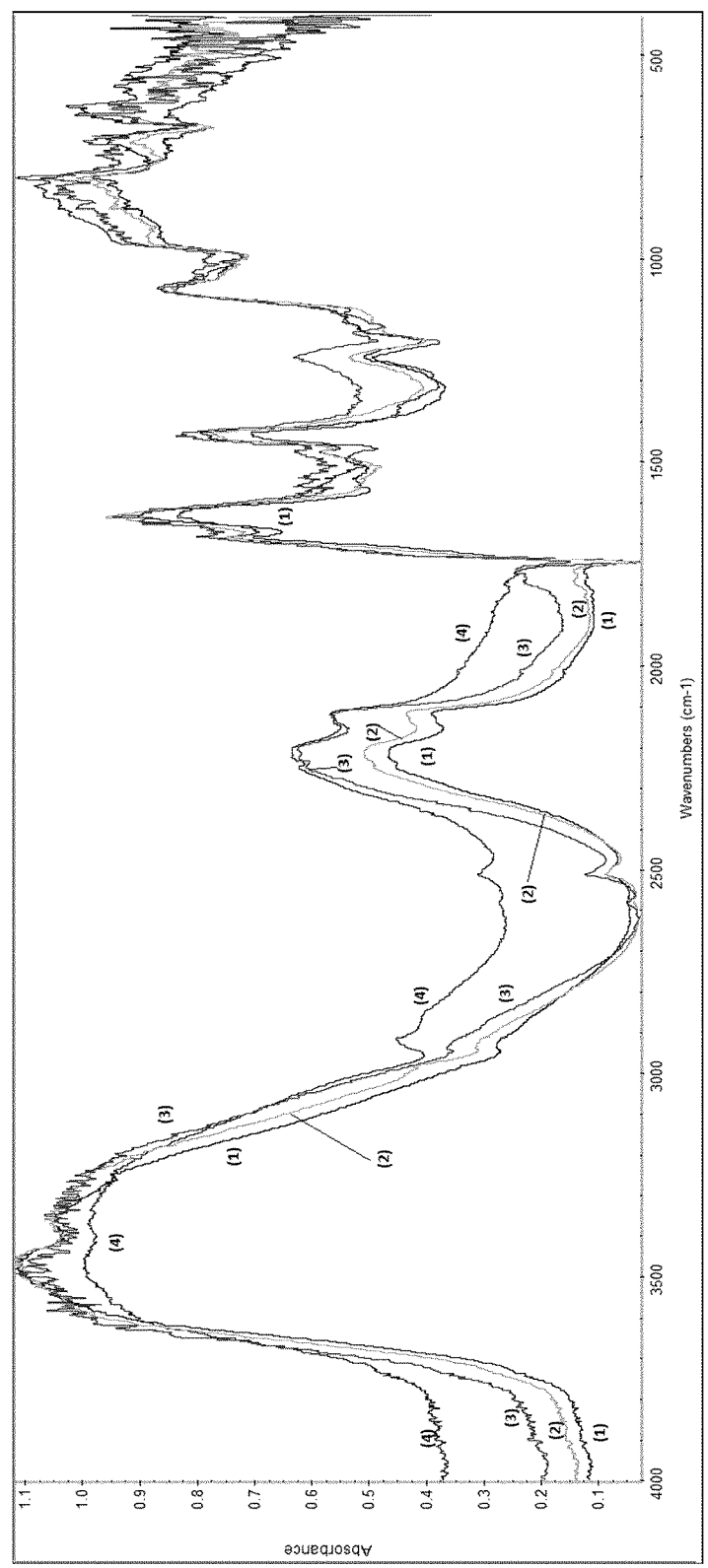
FIG. 27 shows FTIR spectra for PICVD process: (1) Experiment #4, (2) Experiment #5, (3) Experiment #3, and (4) Experiment #2 of Example 4.

To verify this deposition of syngas on the particles, FTIR analysis was performed to study the organic coating and identify functional groups. FIG. 27 shows the FTIR spectra taken from four series of experiments. Table 9 represents the likely assignments of the identified peaks in the FTIR spectra.

TABLE 9

Peak Assignment in the Infrared Spectra of Dried Samples Under PICVD Coating Process

| Peak Absorption Band ($cm^{-1}$) | Peak Assignment |
|---|---|
| 3600-3100 | Hydroxyl group, hydrogen-bonded, O—H stretch in aliphatic alcohol |
| 1350-1260 | Primary or secondary alcohol, O—H in plane bend |
| ~1050 | Primary alcohol, C—O stretch |
| ~1150 | Tertiary alcohol, C—O stretch |
| 3000-2800 | Asymmetric and symmetric methyl (—$CH_3$) and methylene (—$CH_2$—) stretch |
| 2250-2100 | C≡C stretch in alkynes |
| 1680-1630 | C═O stretch in ketones |
| 1475-1430 | $CH_3$ asymmetric and $CH_3$ asymmetric methyl bending in aliphatic compounds |

Clearly, these spectra show almost similar features and organic coating functionalities for all four experiments. However, the intensity of functional groups is different. The very broad peaks in the 3600-3100 $cm^{-1}$ range strongly indicate presence of hydroxyl groups (OH stretch). This peak overlaps the C—H stretch around 2930 $cm^{-1}$. There is also a C—O single bond band near 1100-1300 $cm^{-1}$ specifically in the 1000-1070 $cm^{-1}$ and 1240 $cm^{-1}$ ranges, which demonstrate formation of primary alcoholic functional groups. In the case of experiment #3, the presence of peaks around 1180 $cm^{-1}$ shows the formation of tertiary alcohol. This means a more crosslinked structure was formed in this case compared to the other experimental conditions. Amounts of hydroxyl groups are almost identical in the case of experiments #3, #4, and #5 and they are greater in these experimental conditions compared to experiment #2. In experiments #3 and #5, $H_2O_2$ was used as a photoinitiator, as it can form hydroxyl groups under UVC (254 nm) irradiation due to photolysis. Hydroxyl groups formed due to photolysis of $H_2O_2$ molecules can act as reactive compounds and participate in chain reactions either with CO or $H_2$ molecules or their radicals. Subsequently, more hydroxyl functionality produces in the presence of $H_2O_2$ which leads to a more hydrophilic coating.

However, the FTIR results show that even slight vacuum conditions (experiments #4 and #5) can lead to a similar intensity of the hydroxyl bands to that which was observed for experiments with $H_2O_2$. The medium width peak at 1630-1680 $cm^{-1}$ represents ketonic functionality (C═O stretch). The C≡C stretch bands at 2260-2100 $cm^{-1}$ shows the unsaturated functional groups in the coating. As FIG. 27 shows, the amounts of unsaturated C≡C functionality is greater in the case of experiments #2 and #3 (near atmospheric pressure) compared to the experiments #4 and #5 (slight vacuum pressure). On the other hand, peaks around 1475-1430 $cm^{-1}$ are related to the formation of aliphatic groups (—$CH_3$ and —$CH_2$—). FIG. 27 suggests almost identical amounts of aliphatic groups are produced in the case of experiments under slight vacuum pressure (experiments #4 and #5). However, in the case of near atmospheric pressure experiments (experiments #2 and #3), more aliphatic chain forms in the presence of $H_2O_2$ (experiment #3) than its absence (experiment #2). Thus, it is possible to deduce that longer aliphatic chains with more ketone (C═O stretch) and unsaturated alkyne groups (C≡C stretch) are produced in the presence of $H_2O_2$ and at atmospheric pressure (experiment #3), while at near atmospheric pressure more aliphatic groups are formed. Unsaturated coatings have the possibility of undergoing further reactions to add more functionality to the coating, if desired. On the other hand, slight vacuum pressure can lead to results comparable to $H_2O_2$ injection, at least in terms of the presence of hydroxyl groups.

Conclusion

PICVD was used for direct extraction and functional encapsulation of nanoparticles from MSW fly ash powder. Syngas was used as a precursor for polymeric film deposition in the presence of UVC lamps. Results indicate extraction of functionalized nanoparticles, thus demonstrating the performance of PICVD.

The scope of the claims should not be limited by the preferred embodiments set forth in the examples, but should be given the broadest interpretation consistent with the description as a whole.

REFERENCES

The present description refers to a number of documents, the content of which is herein incorporated by reference in their entirety. These documents include, but are not limited to, the following:

1. K. L. Choy. Chemical vapour deposition of coatings. Progress in Materials Science 48 (2003) 57-170 (in particular section 12.3.2).
2. P. B. Comita, J. Farkas, B. Yang, Y. H. Chuang, J. O'Connor et al. Applied Physics Letters. 66, 1463 (1995) (in particular the Introduction and references 6, 7, and 11).
3. F. Truica-Marasescu and M. R. Wertheimer. Macromolecular Chemistry and Physics, 2005, 206, 744-757 (in particular the Introduction and references 3-18).

4. F. Truica-Marasescu and M. R. Wertheimer. Macromolecular Chemistry and Physics, 2008, 209, 1043-1049 (in particular the section entitled "VUV Photolysis of $NH_3$ and $C_2H_4$ molecules").
5. S. Vidal, F. Maury, A. Gleizes, and C. Mijoule. Applied Surface Science 168 (2000) 57-60 (in particular the Introduction, section 3.1, references 7, 8, and 15).
6. C. A. Dorval Dion and J. R. Tavares. Scalable gas phase nanoparticle treatment methods required for large-scale nanofluid and nanocomposite synthesis. Nanotechnology 2012: Electronics, Devices, Fabrication, MEMS, Fluidics and Computational, 2:392{395, 2012.
7. C. A. Dorval Dion and J. R. Tavares. Photo-initiated chemical vapor deposition as a scalable particle functionalization technology (a practical review). Powder Technology, 239(0):484-491, 2013.
8. J. H. Rhieu. Photo-cvd system, Jun. 1 1993. U.S. Pat. No. 5,215,588.
9. Jason Tavares, Edward J. Swanson, and Sylvain Coulombe. Plasma Synthesis of Coated Metal Nanoparticles with Surface Properties Tailored for Dispersion. Plasma Processes and Polymers, 5(8):759{769, Oct. 14 2008.
10. S. Tsuo and A. A. Langford. Method and apparatus for removing and preventing window deposition during photochemical vapor deposition (photo-cvd) processes, Mar. 28 1989. U.S. Pat. No. 4,816,294.
11. U.S. Pat. No. 4,435,445.
12. U.S. Pat. No. 5,215,588.
13. R. Silverstein, G. Bassler, T. Morrill, Spectrometric Identification of Organic Compounds, 4th edition John Wiley & Sons, 1981.
14. K. Nakanishi, P. H. Solomon, Infrared Absorption Spectroscopy, 2nd edition Holden-Day, 1977.

The invention claimed is:

1. A method for producing a carbon polymer coating on a substrate, the method comprising the steps of:
    introducing the substrate in a photo-initiated chemical vapor deposition reactor,
    introducing carbon monoxide (CO) and hydrogen ($H_2$), as gas precursors, in the reactor, and
    irradiating said gas precursors with a UVC lamp having a main emission peak between about 100 nm and about 300 nm, thereby at least partly photodissociating the carbon monoxide, until the carbon polymer coating is formed.

2. The method of claim 1, wherein the UVC lamp is a low pressure germicidal lamp.

3. The method of claim 1, wherein the UVC lamp has a wavelength of about 254 nm.

4. The method of claim 1, wherein the UVC lamp is a xenon lamp, a krypton lamp, an excimer xenon lamp, a deuterium lamp, or a germicidal lamp.

5. The method of claim 1, wherein the pressure in the reactor is between about 0.75 and 1.25 atm.

6. The method of claim 1, wherein the gas precursors are heated at a temperature above room temperature.

7. The method of claim 1, wherein the hydrogen and the carbon monoxide are present in a $H_2/CO$ ratio varying between about 1/16 to about 4.

8. The method of claim 1, wherein the carbon monoxide and the hydrogen are contained in syngas.

9. The method of claim 1, wherein the substrate is held at a temperature between about 20 and about 80° C.

10. The method of claim 1, wherein the substrate is copper, wood, steel, $TiO_2$, ZnO, or ash.

11. The method of claim 1, wherein the substrate is in the form of nanoparticles.

12. The method of claim 11, wherein the nanoparticles are in a fluidized state during the irradiating step.

13. The method of claim 1, wherein the substrate is ash comprising nanoparticles mixed with bigger particles.

14. The method of claim 13 further comprising, once the nanoparticles and the bigger particles are coated, the step of:
    (c) isolating the coated nanoparticles from the coated bigger particles.

15. The method of claim 14, wherein step c) comprises:
    (c') dispersing the coated ash in a suspension liquid,
    (c") allowing the coated bigger particles to settle and allowing a supernatant comprising the coated nanoparticles to form,
    (c''') separating the supernatant from the settled bigger particles.

16. The method of claim 15, further comprising after step (c'''), the step of:
    (d) drying the supernatant to obtain coated nanoparticles in powder form.

17. A coated substrate produced by the method of claim 1, the coated substrate having a FTIR spectrum exhibiting a peak at about 666 $cm^{-1}$.

18. The coated substrate of claim 17 having a FTIR spectrum exhibiting peaks at about 2925, about 1585, about 1263, about 1100, and about 666 $cm^{-1}$.

* * * * *